(12) United States Patent
Sun et al.

(10) Patent No.: US 11,810,508 B2
(45) Date of Patent: Nov. 7, 2023

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Huaping Sun, Beijing (CN); Erlong Song, Beijing (CN); Qiang Fu, Beijing (CN); Kai Zhang, Beijing (CN); Dongjie Wu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 17/773,445

(22) PCT Filed: Jul. 30, 2021

(86) PCT No.: PCT/CN2021/109767
§ 371 (c)(1),
(2) Date: Apr. 29, 2022

(87) PCT Pub. No.: WO2023/004785
PCT Pub. Date: Feb. 2, 2023

(65) Prior Publication Data
US 2023/0030463 A1    Feb. 2, 2023

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2330/00* (2013.01)

(58) Field of Classification Search
CPC ........ G09G 3/3233; G09G 2300/0426; H10K 59/131
See application file for complete search history.

(56) References Cited

U.S. PATENT DOCUMENTS

| | | |
|---|---|---|
| 9,842,893 B2 | 12/2017 | Sun-Ja et al. |
| 2016/0240601 A1 | 8/2016 | Sun-Ja et al. |
| | (Continued) | |

FOREIGN PATENT DOCUMENTS

| | | |
|---|---|---|
| CN | 108206203 A | 6/2018 |
| CN | 110114885 A | 8/2019 |
| | (Continued) | |

OTHER PUBLICATIONS

Written Opinion from PCT/CN2021/109767 dated Mar. 28, 2022.

*Primary Examiner* — Kevin M Nguyen
(74) *Attorney, Agent, or Firm* — Calfee, Halter & Griswold LLP

(57) ABSTRACT

A display panel including a pixel driving circuit including a driving transistor (T3), a first transistor (T1) having a gate electrode connected to a first gate line (3Re1) and a first electrode connected to a gate electrode of the driving transistor (T3), and a second transistor (T2) having a gate electrode connected to a second gate line (3G1), a first electrode connected to the gate electrode of the driving transistor (T3), and a second electrode connected to a second electrode of the driving transistor (T3), the driving transistor (T3) is a P type transistor, and the first transistor (T1) and the second transistor (T2) are N type transistors, wherein the display panel further includes: a base substrate, a first conductive layer, a third conductive layer, and a first conducting part (41).

23 Claims, 15 Drawing Sheets

(56) References Cited

U.S. PATENT DOCUMENTS

| | | | | |
|---|---|---|---|---|
| 2016/0254340 A1* | 9/2016 | Kwon | ................... | H01L 27/124 257/40 |
| 2017/0059908 A1* | 3/2017 | Yen | ...................... | H01L 27/124 |
| 2019/0073957 A1 | 3/2019 | Taehoon et al. | | |
| 2019/0103575 A1* | 4/2019 | Park | ................... | H10K 59/1213 |
| 2021/0193780 A1 | 6/2021 | Yongfu et al. | | |
| 2021/0366393 A1 | 11/2021 | Yongfu et al. | | |

FOREIGN PATENT DOCUMENTS

| | | | |
|---|---|---|---|
| CN | 110619849 A | 12/2019 | |
| CN | 110648629 A | 1/2020 | |
| CN | 111179855 A | 5/2020 | |
| CN | 111223435 A | 6/2020 | |
| CN | 111403465 A | 7/2020 | |
| CN | 112071268 A | 12/2020 | |
| CN | 112259610 A | 1/2021 | |
| CN | 112289267 A | 1/2021 | |
| CN | 112365849 A | 2/2021 | |
| CN | 111179855 B | 3/2021 | |
| CN | 113224123 A | 8/2021 | |
| WO | 2021102904 A1 | 6/2021 | |
| WO | 2021184897 A1 | 9/2021 | |

\* cited by examiner

DISPLAY PANEL AND DISPLAY DEVICE

CROSS REFERENCE

The present application is based upon International Application No. PCT/CN2021/109767, filed on Jul. 30, 2021, and the entire contents thereof are incorporated herein by reference.

TECHNICAL FIELD

The present disclosure relates to the field of display technology, in particular, to a display panel and a display device.

BACKGROUND

In the related art, the pixel driving circuit can be formed using a low temperature polycrystalline oxide (LTPO) technology, which may form the pixel driving circuit by combining an N-type metal oxide transistor and a P-type low temperature polycrystalline silicon transistor.

It should be noted that, information disclosed in the above background portion is provided only for better understanding of the background of the present disclosure, and thus it may contain information that does not form the prior art known by those ordinary skilled in the art.

SUMMARY

According to one aspect, the present disclosure provides a display panel, the display panel includes a pixel driving circuit including a driving transistor, a first transistor having a gate electrode connected to a first gate line and a first electrode connected to a gate electrode of the driving transistor, and a second transistor having a gate electrode connected to a second gate line, a first electrode connected to the gate electrode of the driving transistor, and a second electrode connected to a second electrode of the driving transistor, the driving transistor is a P type transistor, and the first transistor and the second transistor are N type transistors, wherein the display panel further includes: a base substrate, a first conductive layer, a third conductive layer, and a first conducting part, wherein the first conductive layer is disposed at a side of the base substrate and includes a first conductive part configured to form the gate electrode of the driving transistor, the third conductive layer is disposed at a side of the base substrate and includes the first gate line and the second gate line, orthographic projections of the first gate line and the second gate line on the base substrate are both extended along a first direction, and an orthographic projection of the first conductive part on the base substrate is positioned between the orthographic projection of the first gate line on the base substrate and the orthographic projection of the second gate line on the base substrate; the first connecting part is connected to the first conductive part via a through hole, and is connected to the first electrode of the first transistor and the first electrode of the second transistor, wherein an orthographic projection of the first connecting part on the base substrate is positioned between the orthographic projection of the first gate line on the base substrate and the orthographic projection of the second gate line on the base substrate.

In an exemplary embodiment of the present disclosure, the third conductive layer is disposed at a side of the first conductive layer away from the base substrate, and the display panel further includes: a fourth conductive layer disposed at a side of the third conductive layer away from the base substrate and including the first connecting part.

In an exemplary embodiment of the present disclosure, the display panel further includes: a second active layer, disposed between the third conductive layer and the first conductive layer and including a first active part, wherein the first active part includes a first sub active part, a second sub active part and a third sub active part connected between the first sub active part and the second sub active part, and wherein the first sub active part is configured to form a channel region of the first transistor, and the second sub active part is configured to form a channel region of the second transistor, wherein the first connecting part is connected to the third sub active part via a through hole.

In an exemplary embodiment of the present disclosure, the third sub active part includes a first extending part, wherein an orthographic projection of the first extending part on the base substrate is extended in a second direction, at least a part of orthographic projection of the first extending part on the base substrate is disposed opposite to the orthographic projection of the first conductive part on the base substrate in the first direction, and the second direction is intersected with the first direction, wherein at least a part of the orthographic projection of the first connecting part on the base substrate is extended along the first direction, and the first connecting part is connected to the first extending part via a through hole.

In an exemplary embodiment of the present disclosure, an orthographic projection of the second sub active part on the base substrate and the orthographic projection of the first conductive part on the base substrate are disposed at a same side of the orthographic projection of the second gate line on the base substrate.

In an exemplary embodiment of the present disclosure, the orthographic projection of the second sub active part on the base substrate is positioned at a side of the orthographic projection of the first extending part on the base substrate along the first direction, and the orthographic projection of the second sub active part on the base substrate is positioned on a side of orthographic projection of the first extending part on the base substrate facing the orthographic projection of the first conductive part on the base substrate, and the third conductive layer further includes: a first protrusion part connected to the second gate line, wherein an orthographic projection of the first protrusion part on the base substrate is covered on the second sub active part, and at least a part of the first protrusion part is configured to form a first gate electrode of the second transistor, and wherein, the orthographic projection of the first protrusion part on the base substrate is positioned between the orthographic projection of the second gate line on the base substrate and the orthographic projection of the first connecting part on the base substrate.

In an exemplary embodiment of the present disclosure, the first active part includes a fourth sub active part, connected to an end of the second sub active part away from the third sub active part, wherein along the second direction, an orthographic projection of the fourth sub active part on the base substrate is positioned between the orthographic projection of the first conductive part on the base substrate and the orthographic projection of the second gate line on the base substrate, and the second direction is intersected with the first direction.

In an exemplary embodiment of the present disclosure, the display panel further includes a first active layer, disposed between the base substrate and the first conductive layer and including a third active part, wherein the third active part is configured to form a channel region of the driving transistor, wherein an orthographic projection of the third active part on the base substrate is extended along a second direction, and the second direction is intersected with the first direction.

In an exemplary embodiment of the present disclosure, a size of the orthographic projection of the first conductive part on the base substrate along the first direction is smaller than a size of the orthographic projection of the first conductive part on the base substrate along the second direction.

In an exemplary embodiment of the present disclosure, the pixel driving circuit further includes a fourth transistor, a gate electrode of the fourth transistor is connected to a third gate line, and a second electrode of the fourth transistor is connected to a first electrode of the driving transistor, and wherein the first conductive layer further includes the third gate line, and an orthographic projection of the third gate line on the base substrate is positioned at a side of the orthographic projection of the first gate line on the base substrate away from the orthographic projection of the first conductive part on the base substrate.

In an exemplary embodiment of the present disclosure, the display panel further includes a fifth conductive layer, disposed at a side of the fourth conductive layer away from the base substrate and including a power supply line, wherein an orthographic projection of the power supply line on the base substrate is covered on the orthographic projection of the first active part on the base substrate.

In an exemplary embodiment of the present disclosure, wherein the power supply line includes: a first power supply line, wherein an orthographic projection of the first power supply line on the base substrate is extended along the first direction; and a second power supply line, connected to the first power supply line, wherein an orthographic projection of the second power supply line on the base substrate is extended along a second direction, and the second direction is intersected with the first direction.

In an exemplary embodiment of the present disclosure, the orthographic projection of the first power supply line on the base substrate is positioned between the orthographic projection of the first conductive part on the base substrate and the orthographic projection of the second gate line on the base substrate.

In an exemplary embodiment of the present disclosure, the display panel further includes a second active layer disposed between the third conductive layer and the first conductive layer and including a first active part, wherein the first active part includes a fourth sub active part, a second sub active part, a first extending part and a first sub active part that are successively connected, and wherein the first sub active part is configured to form a channel region of the first transistor, and the second sub active part is configured to form a channel region of the second transistor, wherein an orthographic projection of the fourth sub active part on the base substrate and an orthographic projection of the second sub active part on the base substrate are arranged successively along the first direction, and wherein an orthographic projection of the first extending part on the base substrate and an orthographic projection of the first sub active part on the base substrate are arranged successively along the second direction, the orthographic projection of the first power supply line on the base substrate is covered on the orthographic projection of the fourth sub active part on the base substrate and the orthographic projection of the second sub active part on the base substrate, and the orthographic projection of the second power supply line on the base substrate is covered on the orthographic projection of the first extending part on the base substrate, and the orthographic projection of the first sub active part on the base substrate.

In an exemplary embodiment of the present disclosure, a second electrode of the first transistor is connected to a first initial signal line, the display panel further includes a light emitting unit, and the pixel driving circuit further includes a fourth transistor, a seventh transistor, and wherein a gate electrode of the fourth transistor is connected to the third gate line, a second electrode of the fourth transistor is connected to a first electrode of the driving transistor, a first electrode of the seventh transistor is connected to a first electrode of the light emitting unit, and a second electrode of the seventh transistor is connected to a second initial signal line, wherein the first conducive layer further includes: a fourth gate line, wherein an orthographic projection of the fourth gate line on the base substrate is extended along the first direction, and a part of the fourth gate line is configured to form the gate electrode of the seventh transistor, wherein the display panel further includes: a second conductive layer, disposed between the third conductive layer and the first conductive layer and including the first initial signal line, wherein an orthographic projection of the first initial signal line on the base substrate is extended along the first direction, and the orthographic projection of the first initial signal line on the base substrate is positioned at a side of the orthographic projection of the third gate line on the base substrate away from the orthographic projection of the first conductive part on the base substrate, and wherein the third conductive layer includes the second initial signal line, and an orthographic projection of the second initial signal line on the base substrate is extended along the first direction, and the orthographic projection of the second initial signal line on the base substrate is positioned at a side of the orthographic projection of the fourth gate line on the base substrate away from the orthographic projection of the first conductive part on the base substrate.

In an exemplary embodiment of the present disclosure, the display panel includes a plurality of pixel driving circuits, and the plurality of pixel driving circuits includes a first pixel driving circuit and a second pixel driving circuit adjacent along a second direction, wherein the second direction is intersected with the first direction, and an orthographic projection of the first initial signal line in the first pixel driving circuit on the base substrate is at least partly overlapped with an orthographic projection of the second initial signal line in the second pixel driving circuit on the base substrate.

In an exemplary embodiment of the present disclosure, the first initial signal line in the first pixel driving circuit includes a second conductive part, wherein the fourth conductive layer further includes: a second connecting part, connected to the second conductive part via a though hole and connected to the second electrode of the first transistor, and wherein an orthographic projection of the second conductive part in the first pixel driving circuit on the base substrate is not overlapped with the orthographic projection of the second initial signal line in the second pixel driving circuit on the base substrate.

In an exemplary embodiment of the present disclosure, the first initial signal line in the first pixel driving circuit includes: a fourth extending part, wherein an orthographic projection of the fourth extending part on the base substrate is extended in the first direction; a fifth extending part, in a same pixel driving circuit row, a distance between the orthographic projection of the fifth extending part on the base substrate and the orthographic projection of the third gate line on the base substrate along the second direction is smaller than a distance between the orthographic projection of the fourth extending part on the base substrate and the orthographic projection of the third gate line on the base substrate along the second direction, and the fifth extending part includes a first sub extending part and a second sub extending part; and a seventh extending part, connected between the first sub extending part and the fourth extending part. The second initial signal line in the second pixel driving circuit includes: a ninth extending part, wherein an orthographic projection of the ninth extending part on the base substrate is extended in the first direction, and the orthographic projection of the ninth extending part on the base substrate is at least partly overlapped with the orthographic projection of the fourth extending part on the base substrate; a tenth extending part, connected to the ninth extending part, wherein an orthographic projection of the tenth extending part on the base substrate is extended in the first direction, and in a same pixel driving circuit row, a distance between the orthographic projection of the tenth extending part on the base substrate and the orthographic projection of the fourth gate line on the base substrate along the second direction is greater than a distance between the orthographic projection of the ninth extending part on the base substrate and the orthographic projection of the fourth gate line on the base substrate along the second direction, the orthographic projection of the tenth extending part on the base substrate is at least partly overlapped with an orthographic projection of the second sub extending part on the base substrate, and the orthographic projection of the tenth extending part on the base substrate is not overlapped with an orthographic projection of the first sub extending part on the base substrate; and a twelfth extending part, connected between the tenth extending part and the ninth extending part, wherein an angle between an orthographic projection of the twelfth extending part on the base substrate and the orthographic projection of the tenth extending part on the base substrate is greater than an angle between the orthographic projection of the seventh extending part on the base substrate and the orthographic projection of the fifth extending part on the base substrate, and wherein the seventh extending part is configured to form the second conductive part.

In an exemplary embodiment of the present disclosure, the second initial signal line in the second pixel driving circuit includes: an eighth extending part, wherein an orthographic projection of the eighth extending part on the base substrate is extended in the first direction, the tenth extending part is connected between the eighth extending part and the ninth extending part, and in a same pixel driving circuit row, a distance between the orthographic projection of the tenth extending part on the base substrate and the orthographic projection of the fourth gate line on the base substrate along the second direction is greater than a distance between the orthographic projection of the eighth extending part on the base substrate and the orthographic projection of the fourth gate line on the base substrate along the second direction; and an eleventh extending part, connected between the tenth extending part and the eighth extending part, wherein the first initial signal line in the first pixel driving circuit further includes: a third extending part, wherein an orthographic projection of the third extending part on the base substrate is extended in the first direction, the fifth extending part is connected between the third extending part and the fourth extending part, and a distance between the orthographic projection of the fifth extending part on the base substrate and the orthographic projection of the third gate line on the base substrate along the second direction is smaller than a distance between the orthographic projection of the third extending part on the base substrate and the orthographic projection of the third gate line on the base substrate along the second direction, and the orthographic projection of the eighth extending part on the base substrate is at least partly overlapped with the orthographic projection of the third extending part on the base substrate; and a sixth extending part, connected between the fifth extending part and the third extending part, wherein the orthographic projection of the eleventh extending part on the base substrate is at least partly overlapped with the orthographic projection of the sixth extending part on the base substrate, wherein the display panel further includes a first active layer disposed between the base substrate and the first conductive layer, and wherein the first active layer includes: a seventh active part, configured to form a channel region of the seventh transistor; and an eighth active part, connected to a side of the seventh active part, and along the first direction, an orthographic projection of the eighth active part on the base substrate is positioned between the orthographic projection of the sixth extending part on the base substrate and the orthographic projection of the seventh extending part on the base substrate, and the orthographic projection of the eighth active part on the base substrate is opposite to the orthographic projection of the eleventh extending part on the base substrate along the first direction, and wherein the fourth conductive layer further includes: a third connecting part, connected respectively to the eighth active part and the eleventh extending part via through holes.

In an exemplary embodiment of the present disclosure, a size of the orthographic projection of the eleventh extending part on the base substrate along the first direction is greater than the orthographic projection of the tenth extending part on the base substrate along the second direction.

In an exemplary embodiment of the present disclosure, a part of the first gate line is configured to form a first gate electrode of the first transistor, and the display panel further includes a second conductive layer, connected between the first conductive layer and the second active layer, and the second conductive layer includes: a fifth gate line, wherein an orthographic projection of the fifth gate line on the base substrate is extended in the first direction, the orthographic projection of the fifth gate line on the base substrate is at least partly overlapped with the orthographic projection of the first gate line on the base substrate, the fifth gate line is connected to the first gate line via a through hole, and a part of the fifth gate line is configured to form a second gate electrode of the first transistor; a sixth gate line, wherein an orthographic projection of the sixth gate line on the base substrate is extended in the first direction, the orthographic projection of the sixth gate line on the base substrate is at least partly overlapped with the orthographic projection of the second gate line on the base substrate, and the sixth gate line is connected to the second gate line via a through hole; and a second protrusion part, connected to the sixth gate line, wherein an orthographic projection of the second protrusion part on the base substrate is at least partly overlapped with the orthographic projection of the first protrusion part on the base substrate, and at least a part of the second protrusion part is configured to form a second gate electrode of the second transistor, wherein, the orthographic projection of the first connecting part on the base substrate is positioned between the orthographic projection of the fifth gate line on the base substrate and the orthographic projection of the sixth gate line on the base substrate.

In an exemplary embodiment of the present disclosure, the orthographic projection of the first connecting part on the base substrate is extended along the first direction.

According to one aspect, the present disclosure further provides a display device including the above display panel.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without creative effort.

DETAILED DESCRIPTION

Figure 1:
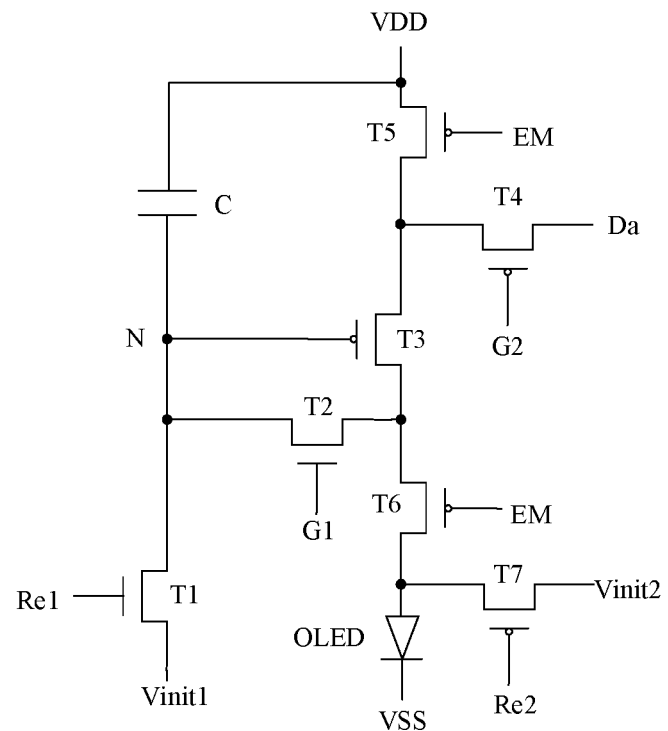
FIG. 1 is a schematic diagram of the circuit structure of the pixel driving circuit in the related art.

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

The terms "a", "an", "the" are used to indicate the presence of one or more elements/components/etc; and the terms "including" and "having" are used to indicate an open-ended inclusive meaning and means that additional elements/components/etc may be present in addition to the listed elements/components/etc.

As shown in FIG. 1, a schematic diagram of the circuit structure of a pixel driving circuit in the related art is shown. The pixel driving circuit may include: a driving transistor T3, a first transistor T1, a second transistor T2, a fourth transistor T4, a fifth transistor T5, a sixth transistor T6, a seventh transistor T7, and a capacitor C. Wherein, the first electrode of the fourth transistor T4 is connected to the data signal terminal Da, the second electrode of the fourth transistor T4 is connected to the first electrode of the driving transistor T3, and the gate electrode of the fourth transistor T4 is connected to the second gate driving signal terminal G2. The first electrode of the fifth transistor T5 is connected to the first power supply terminal VDD, the second electrode of the fifth transistor T5 is connected to the first electrode of the driving transistor T3, and the gate electrode of the fifth transistor T5 is connected to the enable signal terminal EM. The gate electrode of the driving transistor T3 is connected to the node N. The first electrode of the second transistor T2 is connected to the node N, the second electrode of the second transistor T2 is connected to the second electrode of the driving transistor T3, and the gate electrode of the second transistor T2 is connected to the first gate driving signal terminal G1. The first electrode of the sixth transistor T6 is connected to the second electrode of the driving transistor T3, the second electrode of the sixth transistor T6 is connected to the first electrode of the seventh transistor T7, and the gate electrode of the sixth transistor T6 is connected to the enable signal terminal EM. The second electrode of the seventh transistor T7 is connected to the second initial signal terminal Vinit2 and the gate terminal of the seventh transistor T7 is connected to the second reset signal terminal Re2. The first electrode of the first transistor T1 is connected to the node N, the second electrode of the first transistor T1 is connected to the first initial signal terminal Vinit1, and the gate electrode of the first transistor T1 is connected to the first reset signal terminal Re1. The capacitor C is connected between the first power supply terminal VDD and the node N. The pixel driving circuit may be connected to a light emitting unit OLED for driving the light emitting unit OLED, and the light emitting unit OLED may be connected between the second electrode of the sixth transistor T6 and the second power supply terminal VSS. The first transistor T1 and the second transistor T2 can be N-type transistors, for example, the first transistor T1 and the second transistor T2 can be N-type metal oxide transistors. The N-type metal oxide transistors have a smaller leakage current, so as to avoid leakage of the node N through the first transistor T1 and the second transistor T2 during the light-emitting phase. Also, the driving transistor T3, the fourth transistor T4, the fifth transistor T5, the sixth transistor T6, and the seventh transistor T7 may be P-type transistors, for example, the driving transistor T3, the fourth transistor T4, the fifth transistor T5, the sixth transistor T6, and the seventh transistor T7 may be P-type low-temperature multi-crystal silicon transistor. The P-type low-temperature multi-crystal silicon transistors have a high carrier mobility, thereby facilitating the realization of a display panel with high resolution, high response speed, high pixel density, and high opening rate. The first initial signal terminal and the second initial signal terminal can output the same or different voltage signals depending on the actual situation.

Figure 2:
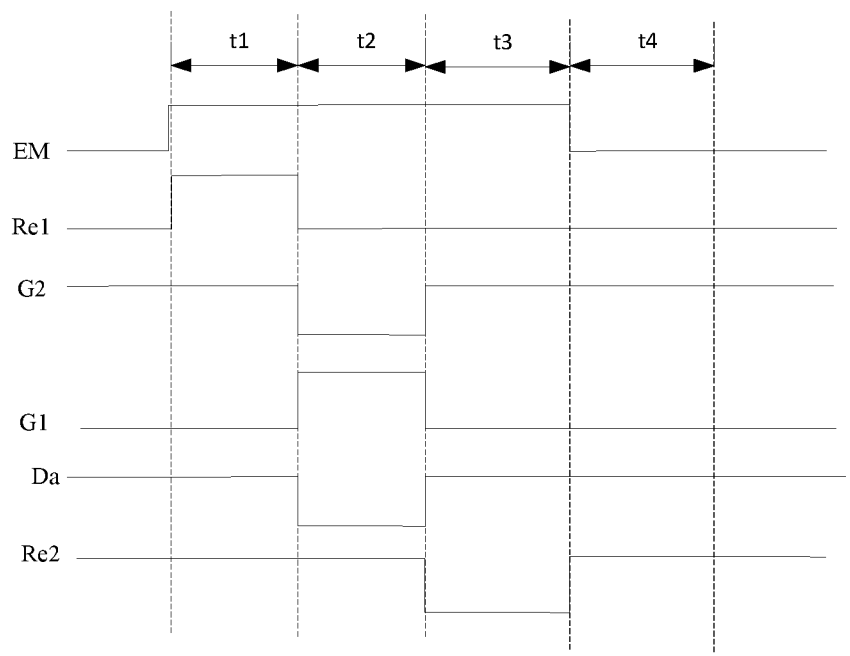
FIG. 2 is a timing diagram of each node of the driving method of the pixel driving circuit of FIG. 1.

As shown in FIG. 2, the timing diagram of each node in the driving method of the pixel driving circuit of FIG. 1 is shown. G1 indicates the timing of the first gate driving signal end G1, G2 indicates the timing of the second gate driving signal end G2, Re1 indicates the timing of the first reset signal end Re1, Re2 indicates the timing of the second reset signal end Re2, EM indicates the timing of the enable signal end EM, and Da indicates the timing of the data signal end Da. The driving method of the pixel driving circuit may include a first reset phase t1, a compensation phase t2, a second reset phase t3, and an emitting phase t4. In the first reset phase t1: the first reset signal terminal Re1 outputs a high level signal, the first transistor T1 is turned on, and the first initial signal terminal Vinit1 inputs an initial signal to the node N. In the compensation phase t2: the first gate driving signal terminal G1 outputs a high level signal, the second gate driving signal terminal G2 outputs a low level signal, the fourth transistor T4 and the second transistor T2 are turned on, while the data signal terminal Da outputs a drive signal to write a voltage Vdata+Vth to the node N, where Vdata is the voltage of the drive signal, Vth is threshold voltage of the driving transistor T3. In the second reset phase t3, the second reset signal terminal Re2 outputs a low signal, the seventh transistor T7 is turned on, and the second initial signal terminal Vinit2 inputs an initial signal to the second electrode of the sixth transistor T6. In the emitting phase t4: the enable signal terminal EM outputs a low level signal, the sixth transistor T6 and the fifth transistor T5 are turned on, and the driving transistor T3 emits light under the action of the voltage Vdata+Vth stored in the capacitor C. According to the equation I=(μWCox/2L)(Vgs−Vth)² for the output current of the driving transistor, where μ is the carrier mobility; Cox is the capacitance of the gate electrode per unit area, W is the width of the channel of the driving transistor, L is the length of the channel of the driving transistor, Vgs is the gate-source voltage difference of the driving transistor, and Vth is the threshold voltage of the driving transistor. The output current of the driving transistor in the pixel driving circuit of the present disclosure is I=(μWCox/2L)(Vdata+Vth−Vdd−Vth)². This pixel driving circuit can avoid the influence of the threshold of the driving transistor on its output current. It should be understood that the pixel driving circuit shown in FIG. 1 can also have other driving schemes, for example, both the first transistor T1 and the seventh transistor T7 can be reset in the first reset phase, and thus the driving method can be set without the second reset phase.

Figure 3:
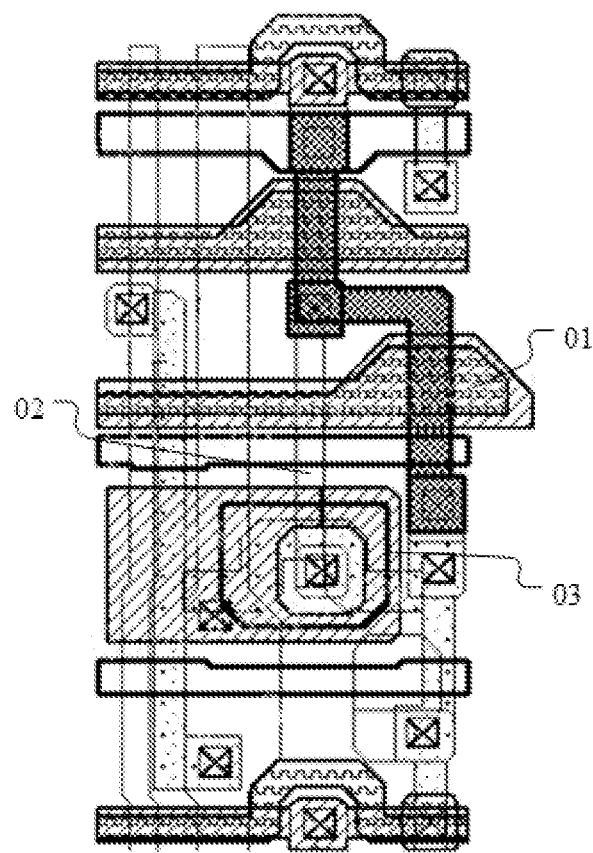
FIG. 3 is a structural diagram of the display in the related art.

As shown in FIG. 3, a structural diagram of a display panel in the related art is shown, the display panel may include the pixel driving circuit shown in FIG. 1. As shown in FIG. 3, the display panel includes a gate line 01, a connecting part 02, and a gate electrode 03, wherein a part of the structure of the gate line 01 is used to form the gate electrode of the second transistor T2 in FIG. 1. The gate electrode 01 can be used to provide the first gate driving signal terminal G1 in FIG. 1. The gate electrode 03 is used to form the gate electrode of the driving transistor T3 in FIG. 1. The connecting part 02 is connected between the gate electrode 03 and the first electrode of the second transistor T2. As shown in FIG. 2, at the end of the compensation phase t2, the potential of the first gate driving signal terminal G1 changes from a high level to a low level, i.e., the potential of the gate line 01 changes from a high level to a low level. As shown in FIG. 3, the gate line 01 and the connecting part 02 are overlapped, and the gate line 01 and the connecting part 02 can form a parallel plate capacitance structure. When the potential of the gate line 01 changes from a high level to a low level, the potential of the connecting part 02 decreases correspondingly under the coupling effect of the parallel plate capacitance structure, and the potential of the gate electrode 03 also decreases, resulting in insufficient data signal writing to the gate electrode of the driving transistor.

Figure 4:
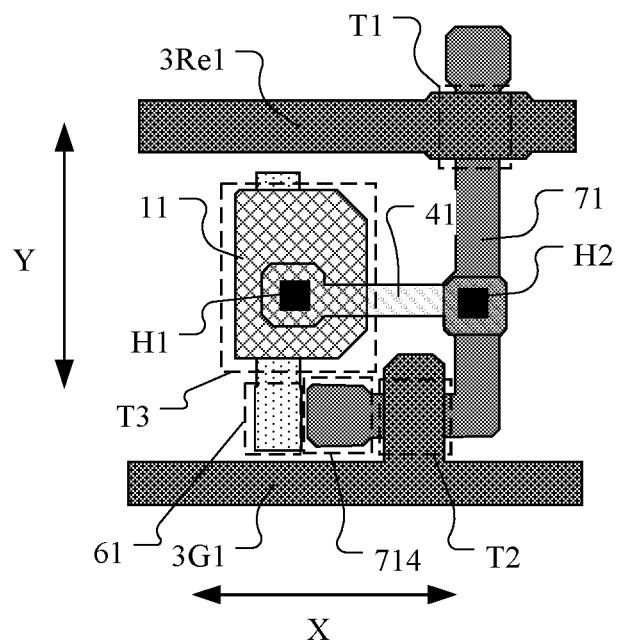
FIG. 4 is a structural diagram of an exemplary embodiment of the display panel of the present disclosure.
Figure 5:
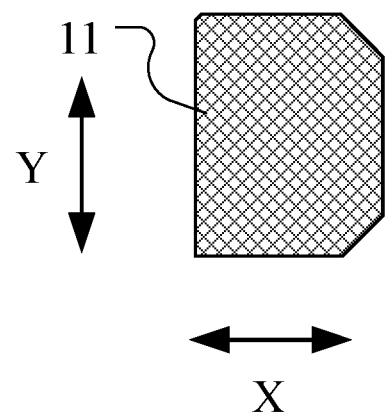
FIG. 5 is a structural diagram of the first conductive layer in FIG. 4.
Figure 6:
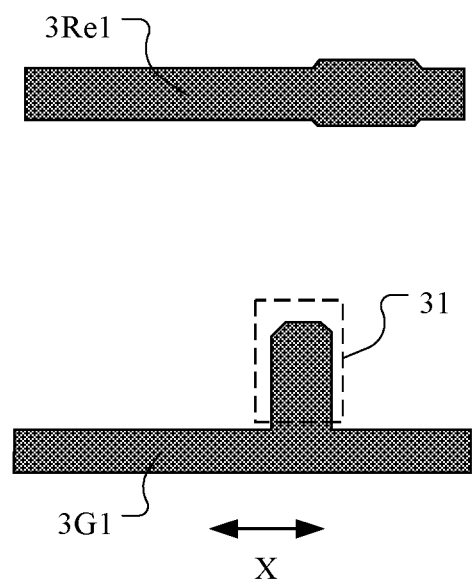
FIG. 6 is a structural diagram of the third conductive layer in FIG. 4.
Figure 7:
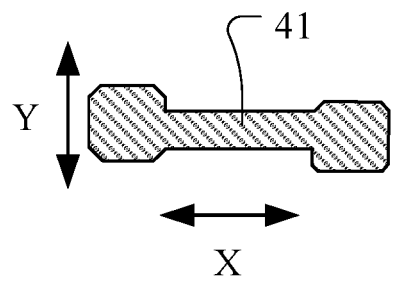
FIG. 7 is a structural diagram of the fourth conductive layer in FIG. 4.

Based thereon, the exemplary embodiment provides a display panel as shown in FIGS. 4, 5, 6, and 7. FIG. 4 shows a structural diagram of an exemplary embodiment of the display panel of the present disclosure, FIG. 5 shows a structural diagram of a first conductive layer in FIG. 4, FIG. 6 shows a structural diagram of a third conductive layer in FIG. 4, and FIG. 7 shows a structural diagram of a fourth conductive layer in FIG. 4. The display panel may include a pixel driving circuit, and the pixel driving circuit may include a driving transistor T3, a first transistor T1, a second transistor T2. A gate electrode of the first transistor T1 is connected to a first gate line 3Re1, and a first electrode of the first transistor T1 is connected to the gate electrode of the driving transistor T3. A gate electrode of the second transistor T2 is connected to the second gate line 3G1, first electrode of the second transistor T2 is connected to the gate electrode of the driving transistor T3 and the second electrode of the second transistor T2 is connected to the second electrode of the driving transistor. The driving transistor T3 is a P type transistor, and the first transistor T1 and the second transistor T2 are N type transistors. The display panel further includes: a base substrate, a first conductive layer, a third conductive layer, and a fourth conductive layer. The first conductive layer may be located on one side of the base substrate and includes a first conductive part 11. The first conductive part 11 may be sued to form the gate electrode of the driving transistor T3. The third conductive layer may be located on the side of the first conductive layer away from the base substrate, and the third conductive layer includes the first gate line 3Re1 and the second gate line 3G1. The orthographic projection of the first gate line 3Re1 on the base substrate and the orthographic projection of the second gate line 3G1 on the base substrate may both extend in the first direction X, and the orthographic projection of the first conductive part 11 on the base substrate is located between the orthographic projection of the first gate line 3Re1 on the base substrate and the orthographic projection of the second gate line 3G1 on the base substrate. The fourth conductive layer may be located on a side of the base substrate and includes a first connecting part 41. The first connecting part may be connected to the first conductive part 11 via a through hole H1, and connect the first electrode of the first transistor and the first electrode of the second transistor. The orthographic projection of first connecting part 41 on the base substrate may be positioned between the orthographic projection of the first gate line 3Re1 on the base substrate and the orthographic projection of the second gate line 3G1 on the base substrate.

In the exemplary embodiment, by providing the orthographic projection of the first conductive part 11 on the base substrate between the orthographic projection of the first gate line 3Re1 on the base substrate and the orthographic projection of the second gate line 3G1 on the base substrate, it is possible to provide the orthographic projection of the first connecting part 41 on the base substrate between the orthographic projection of the first gate line 3Re1 on the base substrate and the orthographic projection of the second gate line 3G1 on the base substrate. That is, it can avoid overlap between the orthographic projection of the first connecting part 41 on the base substrate and the orthographic projection of the second gate line 3G1 on the base substrate, thereby reducing the coupling effect of the second gate line 3G1 to the gate electrode of the driving transistor, and thus improving the problem of insufficient data signal writing.

In this exemplary embodiment, the pixel driving circuit may be as shown in FIG. 1. It should be understood that in other exemplary embodiments, the pixel driving circuit of the display panel in the exemplary embodiment may also have other structures. In other exemplary embodiments, the base substrate, the first conductive layer, the third conductive layer, and the fourth conductive layer may also have other relative arranging relationships, and the first connecting part 41 may also be located in other conductive layers, for example, the first connecting part 41 may also be located in the third conductive layer, etc.

Figure 8:
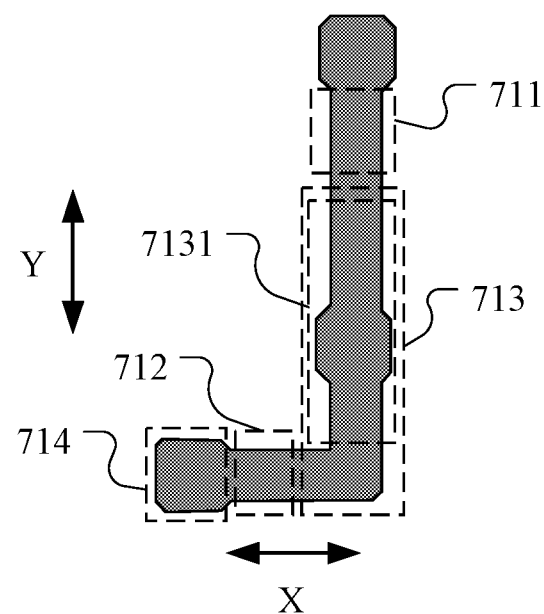
FIG. 8 is a structural diagram of the second active layer in FIG. 4.

In this exemplary embodiment, said display panel may further include a second active layer, as shown in FIGS. 4 and 8. FIG. 8 is a structural diagram of the second active layer in FIG. 4. The second active layer may be disposed between the third conductive layer and the first conductive layer. The second active layer may include a first active part 71, the first active part 71 may include a first sub active part 711, a second sub active part 712, and a third sub active part 713 connected between said first sub active part and said second sub active part. The first sub active part 711 may be used to form the channel region of the first transistor T1, and the second sub active part 712 may be used to form the channel region of the second transistor T2. The first connecting part 41 may be connected to the third sub active part 713 by means of an through H2 to the third sub active part 713.

In this exemplary embodiment, as shown in FIGS. 4 and 8, the third sub active part 713 may include: a first extending part 7131, the orthographic projection of the first extending part 7131 on the base substrate may extend along the second direction Y, and at least a part of the orthographic projection of the first extending part 7131 on the base substrate may be disposed opposite to the orthographic projection of the first conductive part on the base substrate along the first direction, wherein the second direction Y may intersect with the first direction X, for example, the second direction Y may be perpendicular to the first direction X. The orthographic projection of the first connecting part 41 on the base substrate may extend along the first direction X, and the first connecting part 41 may be connected to the first extending part 7131 via the through hole H2. At least a part of the orthographic projection of the first extending part 7131 on the base substrate may be disposed opposite to the orthographic projection of the first conductive part on the base substrate in the first direction X. It can be understood as: the area covered by infinite movement of at least a part of the orthographic projection of the first extending part 7131 on the base substrate in the first direction X and the area covered by infinite movement of the orthographic projection of the first conductive part 11 on the base substrate in the first direction X are overlapped. It should be understood that, in other exemplary embodiments, the first connecting part 41 and the third sub active part 713 may also have other relative positional relationships, for example, at least part of the orthographic projection of the third sub active part 713 on the base substrate may be located on a side of the orthographic projection of the first conductive part on the base substrate along the second direction Y, and correspondingly, the orthographic projection of the first connecting part 41 on the base substrate may extend along the second direction Y.

In this exemplary embodiment, as shown in FIGS. 4 and 8, the orthographic projection of the second sub active part 712 on the base substrate and the orthographic projection of the first conductive part 11 on the base substrate can be located on the same side of the orthographic projection of the second gate line 3G1 on the base substrate. This arrangement can facilitate the connection of the second sub active part 712 with the channel region of the driving transistor located under the first conductive part 11, to connect the second electrode of the second transistor T2 and the second electrode of the driving transistor T3.

In this exemplary embodiment, the orthographic projection of the second sub active part 712 on the base substrate may be located at a side of the orthographic projection of the first extending part 7131 on the base substrate in the first direction X, and the orthographic projection of the second sub active part 712 on the base substrate may be located at a side of the orthographic projection of the first extending part 7131 on the base substrate facing the orthographic projection of the first conductive part 11 on the base substrate. Part of the structure of the first gate line 3Re1 may be used to form the top gate (first gate electrode) of the first transistor. The third conductive layer may further include: a first protrusion part 31, the first protrusion part 31 may be connected to the second gate line 3G1, and the orthographic projection of the first protrusion part 31 on the base substrate may cover the second sub active part 712. At least a part of the first protrusion part 31 may be used to form the top gate (first gate electrode) of the second transistor T2. The orthographic projection of the first protrusion part 31 on the base substrate may be located between the orthographic projection of the second gate line 3G1 on the base substrate and the orthographic projection of the first connecting part 41 on the base substrate. This arrangement can realize that the second sub active part 712 and the first conductive part 11 are located on the same side of the second gate line 3G1.

Figure 9:
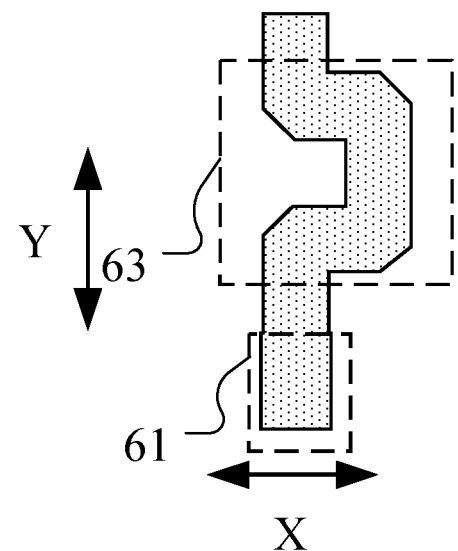
FIG. 9 is a structural diagram of the first active layer in FIG. 4.

In this exemplary embodiment, the display panel further includes a first active layer, as shown in FIGS. 4 and 9. FIG. 9 is a structural diagram of the first active layer in FIG. 4, and the first active layer may be located between the base substrate and the first conductive layer, the first active layer may include a third active part 63, and the third active part 63 may be used to form a channel region of the driving transistor T3. As shown in FIG. 9, the orthographic projection of the third active part 63 on the base substrate may extend along the second direction Y. It should be noted that the orthographic projection of A on the base substrate extending along the direction B can be understood as: the overall orthographic projection of A on the base substrate extends along the direction B, that is, the orthographic projection of A on the base substrate can extend straight or curved in the direction B. As shown in FIG. 9, the first active layer may further include an active part 61 connected to the third active part 63, and the above arrangement can make the orthographic projection of the active part 61 on the base substrate located at a side of the orthographic projection of the first conductive part 11 on the base substrate in the second direction. In this exemplary embodiment, as shown in FIGS. 4 and 8, the first active part 71 may further include: a fourth sub active part 714, and the fourth sub active part 714 may be connected to an end of the second sub active part 712 away from the third sub active part 713. Also, in the second direction Y, the orthographic projection of the fourth sub active part 714 on the base substrate may be located between the orthographic projection of the first conductive part 11 on the base substrate and the orthographic projection of the second gate line 3G1 on the base substrate. The third active part 63 can be connected to the fourth sub active part 714 through the active part 61 to connect the second electrode of the second transistor T2 and the second electrode of the driving transistor T3. This arrangement can improve the integration of the pixel driving circuit. In this exemplary embodiment, the size of the orthographic projection of the first conductive part 11 on the base substrate in the first direction is smaller than the size thereof in the second direction.

In this exemplary embodiment, as shown in FIG. 4, the orthographic projection of the fourth sub active part 714 on the base substrate is opposite to the orthographic projection of the first conductive part on the base substrate in the second direction Y, that is, the area covered by the infinite movement of the orthographic projection of the fourth sub active part 714 on the base substrate in the second direction and the area covered by the infinite movement of the orthographic projection of the first conductive part on the base substrate in the second direction Y are overlapped. It should be understood that, in other exemplary embodiments, the orthographic projection of the fourth sub active part 714 on the base substrate may also be non-opposite to the orthographic projection of the first conductive part on the base substrate in the second direction Y.

Figure 10:
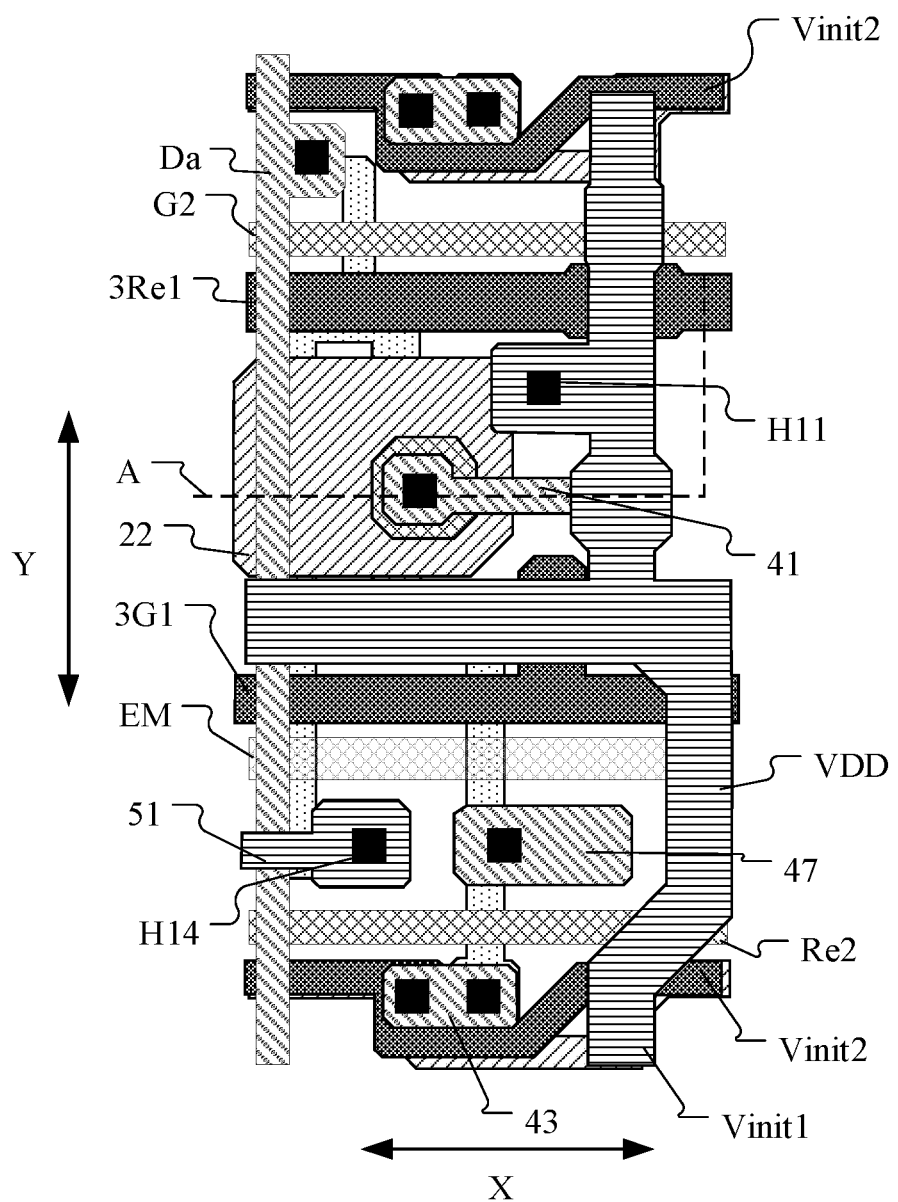
FIG. 10 is a structural diagram of another exemplary embodiment of the display panel of the present disclosure.
Figure 11:
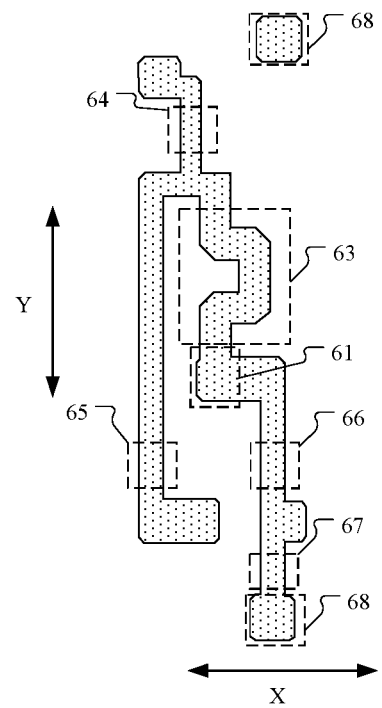
FIG. 11 is a structural diagram of the first active layer in FIG. 10.
Figure 12:
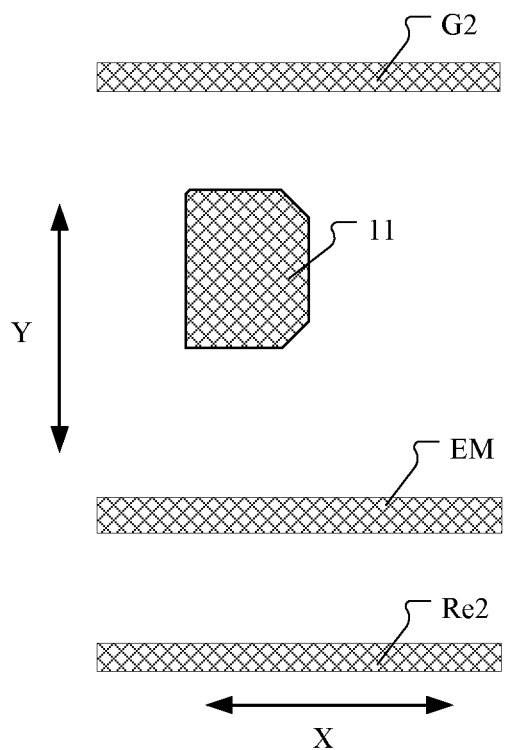
FIG. 12 is a structural diagram of the first conductive layer in FIG. 10.
Figure 13:
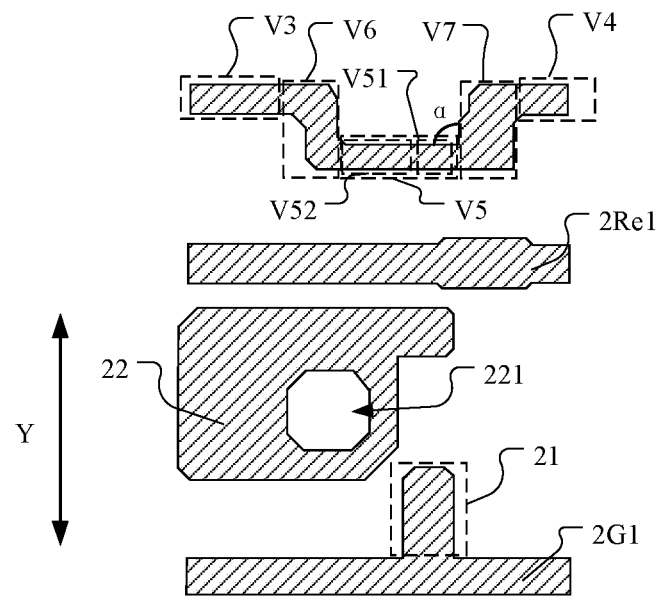
FIG. 13 is a structural diagram of the second conductive layer in FIG. 10.
Figure 13:
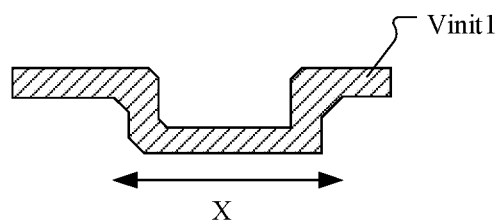
Figure 14:
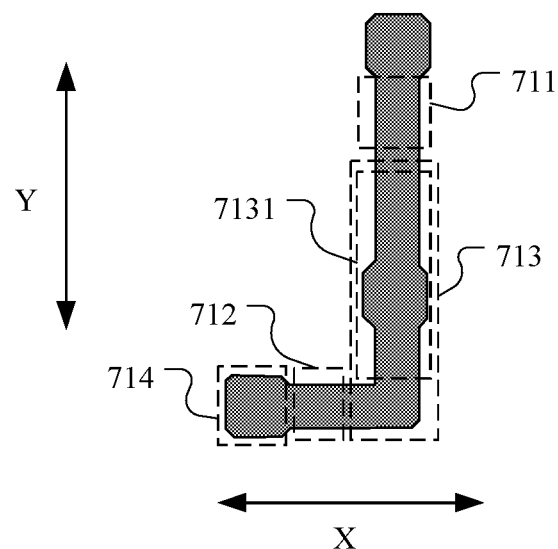
FIG. 14 is a structural diagram of the second active layer in FIG. 10.
Figure 15:
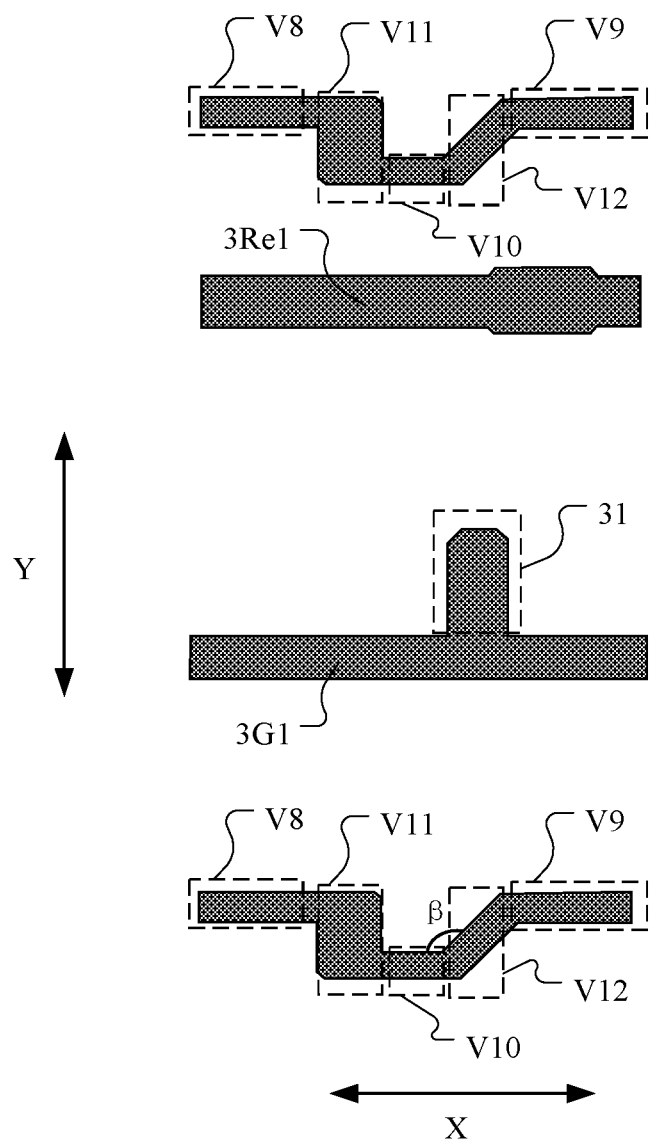
FIG. 15 is a structural diagram of the third conductive layer in FIG. 10.
Figure 16:
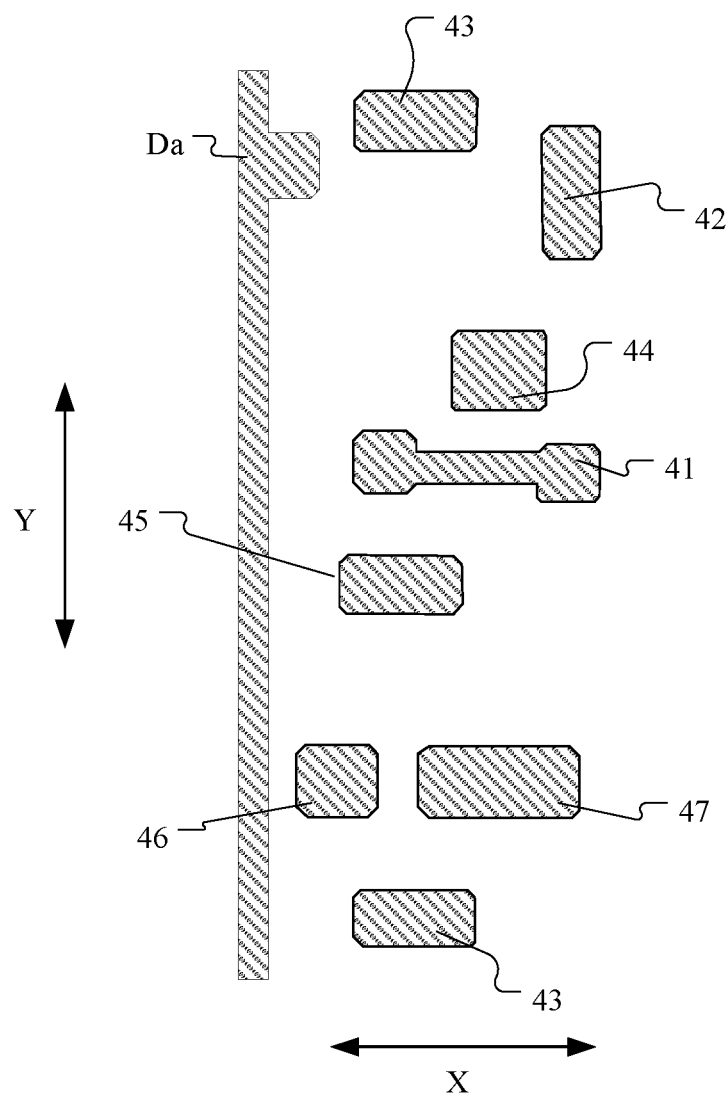
FIG. 16 is a structural diagram of the fourth conductive layer in FIG. 10.
Figure 17:
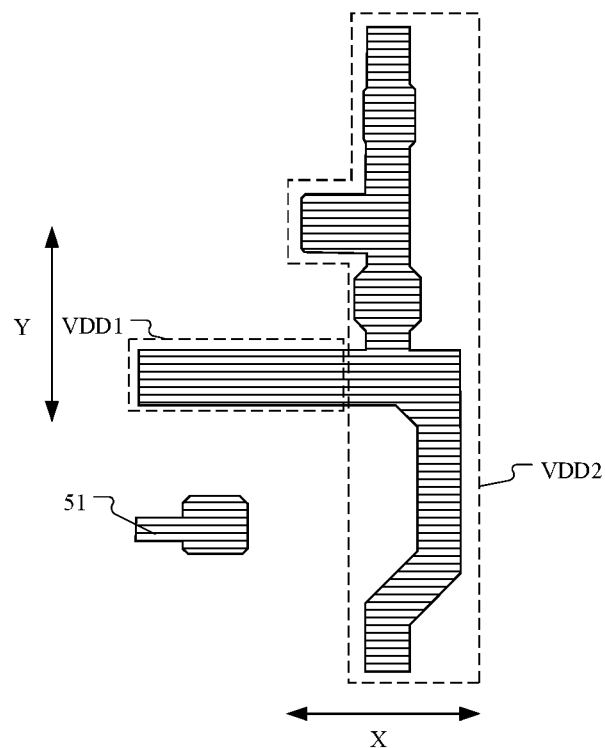
FIG. 17 is a structural diagram of the fifth conductive layer in FIG. 10.
Figure 18:
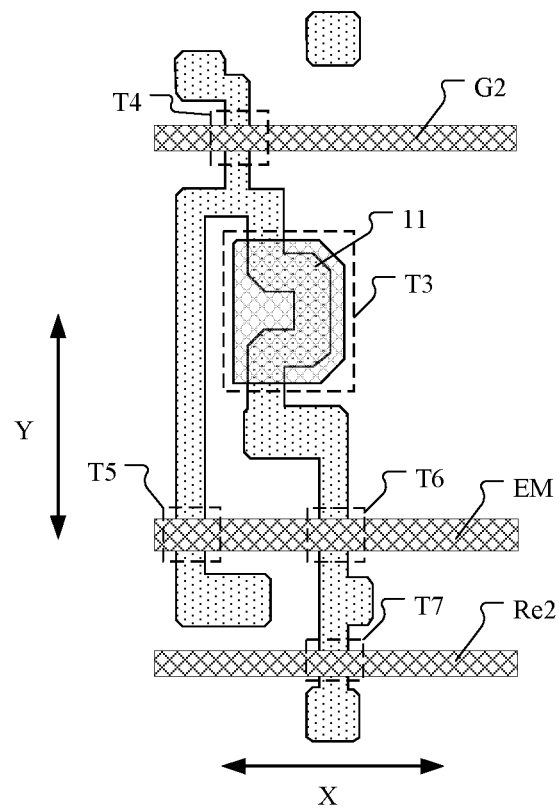
FIG. 18 is a structural diagram of the first active layer and the first conductive layer in FIG. 10.
Figure 19:
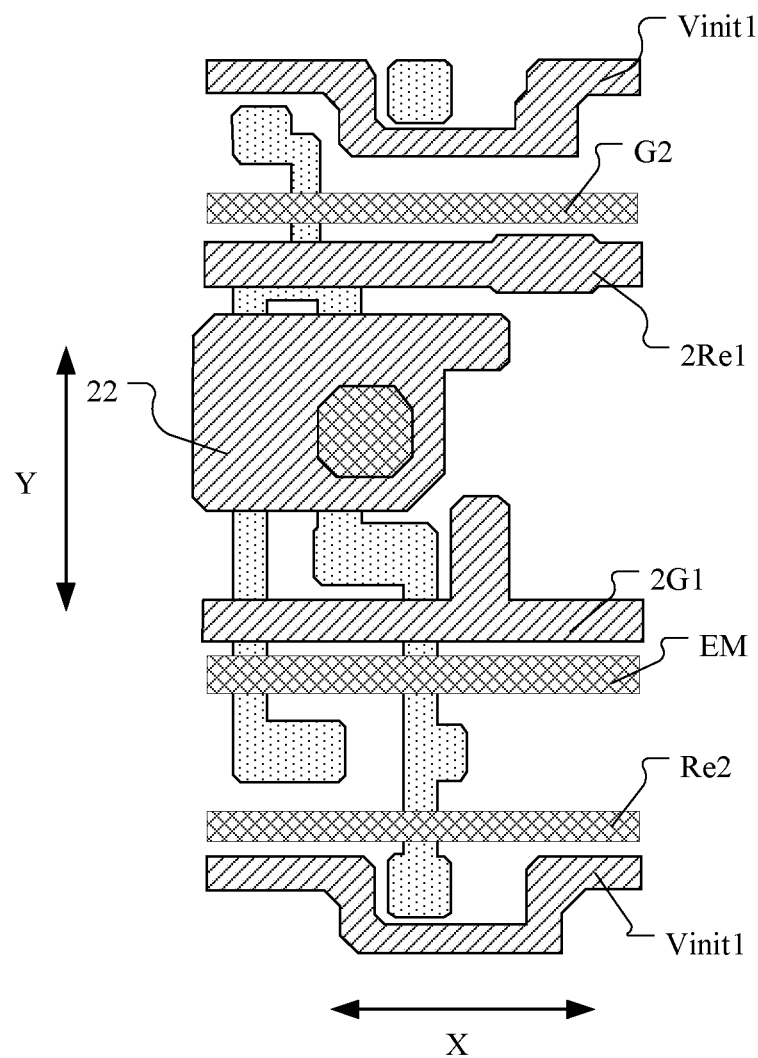
FIG. 19 is a structural diagram of the first active layer, the first conductive layer and the second conductive layer in FIG. 10.
Figure 20:
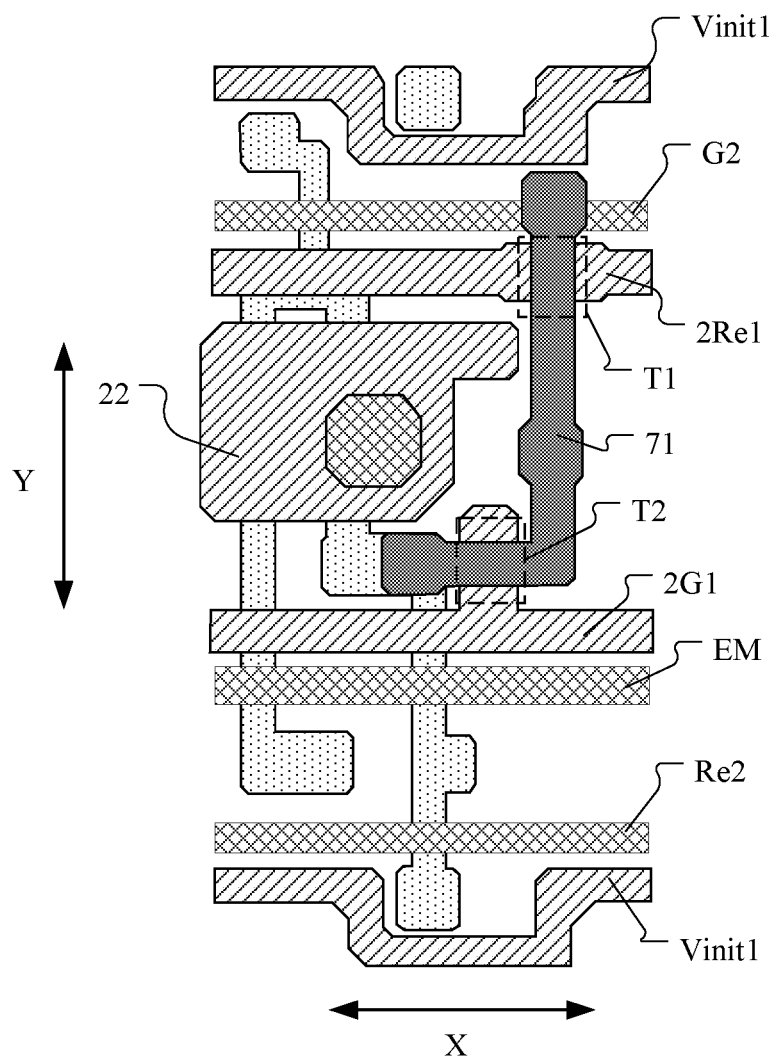
FIG. 20 is a structural diagram of the first active layer, the first conductive layer, the second conductive layer and the second active layer in FIG. 10.
Figure 21:
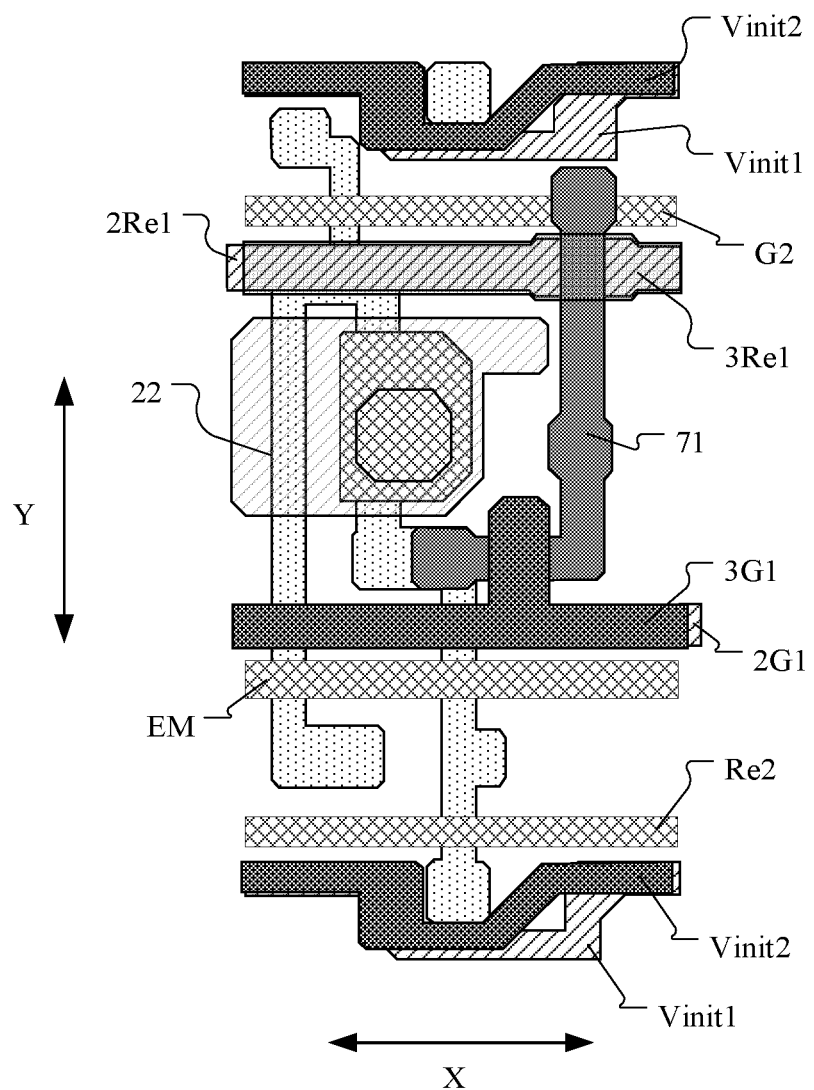
FIG. 21 is a structural diagram of the first active layer, the first conductive layer, the second conductive layer, the second active layer and the third conductive layer in FIG. 10.
Figure 22:
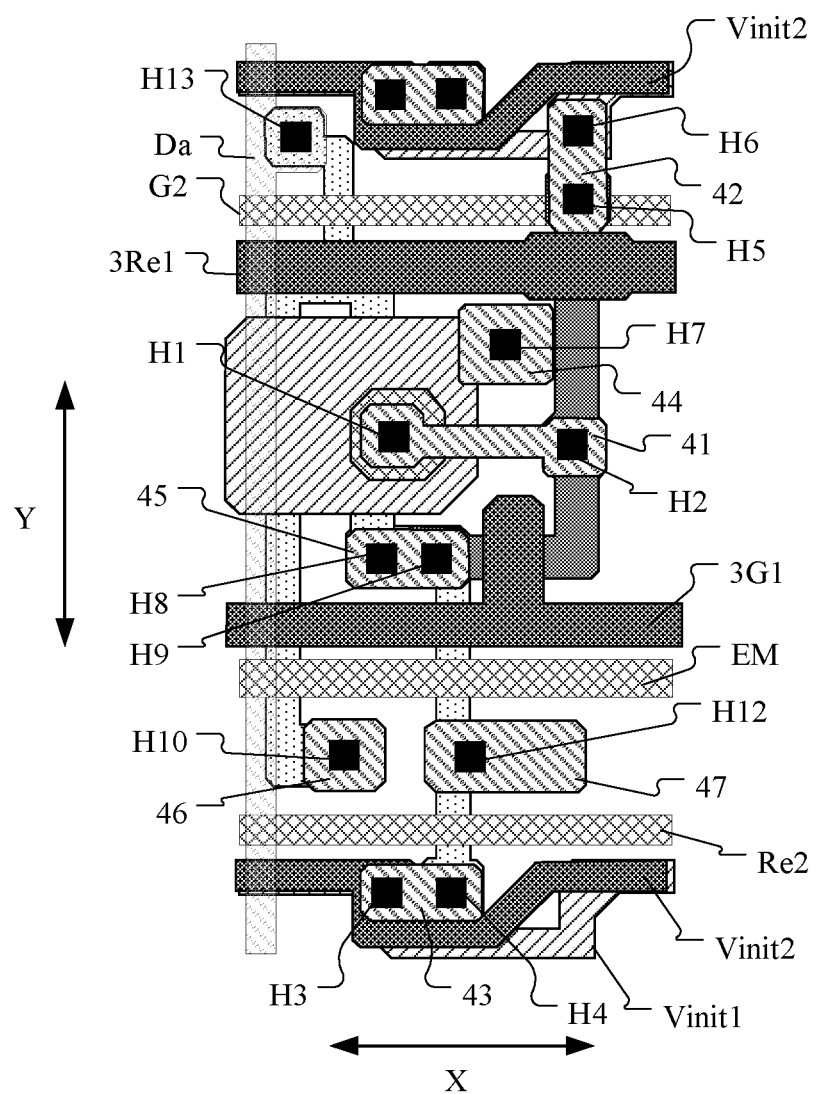
FIG. 22 is a structural diagram of the first active layer, the first conductive layer, the second conductive layer, the second active layer, the third conductive layer and the fourth conductive layer in FIG. 10.

In this exemplary embodiment, the display panel may further include a second conductive layer and a fifth conductive layer, wherein the first active layer, the first conductive layer, the second conductive layer, the second active layer, the third conductive layer, the fourth conductive layer, and the fifth conductive layer may be stacked in sequence. As shown in FIGS. 10-22, FIG. 10 is a structural diagram of another exemplary embodiment of the display panel of the present disclosure, FIG. 11 is a structural diagram of the first active layer in FIG. 10, FIG. 12 is a structural diagram of the first conductive layer in FIG. 10, FIG. 13 is a structural diagram of the second conductive layer in FIG. 10, FIG. 14 is a structural diagram of the second active layer in FIG. 10, FIG. 15 is a structural diagram of the third conductive layer in FIG. 10, FIG. 16 is a structural diagram of the fourth conductive layer in FIG. 10, FIG. 17 is a structural diagram of the fifth conductive layer in FIG. 10, FIG. 18 is a structural diagram of the first active layer and the first conductive layer in FIG. 10, FIG. 19 is a structural diagram of the first active layer, the first conductive layer and the second conductive layer in FIG. 10, FIG. 20 is a structural diagram of the first active layer, the first conductive layer, the second conductive layer and the second active layer in FIG. 10, FIG. 21 is a structural diagram of the first active layer, the first conductive layer, the second conductive layer, the second active layer and the third conductive layer in FIG. 10, and FIG. 22 is a structural diagram of the first active layer, the first conductive layer, the second conductive layer, the second active layer, the third conductive layer and the fourth conductive layer in FIG. 10. The display panel shown in FIG. 10 may have all the structures of the display panel shown in FIG. 4.

As shown in FIGS. 10, 11 and 18, the first active layer may further include: a fourth active part 64, a fifth active part 65, a sixth active part 66, and a seventh active part 67. The fourth active part 64 may be used to form the channel region of the fourth transistor T4, the fifth active part 65 may be used to form the channel region of the fifth transistor T5, the sixth active part may be used to form the sixth transistor In the channel region of T6, and the seventh active part 67 may be used to form the channel region of the seventh transistor T7. The first active layer may be formed of polysilicon, and correspondingly, the driving transistor T3, the fourth transistor T4, the fifth transistor T5, the sixth transistor T6, and the seventh transistor T7 may be P-type low temperature polysilicon transistors.

As shown in FIGS. 10, 12 and 18, the first conductive layer may further include a third gate line G2, a fourth gate line Re2, and an enable signal line EM. The orthographic projection of the third gate line G2 on the base substrate, the orthographic projection of the fourth gate line Re2 on the base substrate, and the orthographic projection of the enabling signal line EM on the base substrate may all extend along the first direction X. The orthographic projection of the third gate line G2 on the base substrate may cover the orthographic projection of the fourth active part 64 on the base substrate, and a partial structure of the third gate line G2 may be used to form the gate electrode of the fourth transistor T4. The third gate line G2 may provide the second gate driving signal terminal G2 in FIG. 1. The orthographic projection of the fourth gate line Re2 on the base substrate can cover the orthographic projection of the seventh active part 67 on the base substrate, and the partial structure of the fourth gate line Re2 can be used to form the gate electrode of the seventh transistor. The fourth gate Re2 may be used to provide the second reset signal terminal Re2 in FIG. 1. The orthographic projection of the enable signal line EM on the base substrate can cover the orthographic projection of the fifth active part 65 on the base substrate and the orthographic projection of the sixth active part 66 on the base substrate. A part of the structure of the enable signal line EM can be used to form the gate electrode of the fifth transistor T5, and another part of the structure of the enable signal line EM can be used to form the gate electrode of the sixth transistor T6. The enable signal line EM can be used to provide the enable signal terminal EM in FIG. 1. The orthographic projection of the third gate line G2 on the base substrate, the orthographic projection of the first conductive part 11 on the base substrate, the orthographic projection of the enable signal line EM on the base substrate, the orthographic projection of the fourth gate line Re2 on the base substrate may be sequentially arranged in the second direction Y. The first conductive part 11 may also be used to form an electrode of the capacitor C in FIG. 1. The display panel can use the first conductive layer as a mask to conduct conduction treatment on the first active layer, that is, the area covered by the first conductive layer can be form as the channel region of the transistor, and the area not covered by the first conductive layer can be formed as conductor structures.

As shown in FIGS. 10, 13 and 19, the second conductive layer may include a first initial signal line Vinit1, a fifth gate line 2Re1, a sixth gate line 2G1, a conductive part 22, and a second protrusion part 21. The orthographic projection of the fifth gate line 2Re1 on the base substrate, the orthographic projection of the sixth gate line 2G1 on the base substrate, and the orthographic projection of the first initial signal line Vinit1 on the base substrate are all may extend along the first direction X. The second protrusion part 21 may be connected to the sixth gate line 2G1, a partial structure of the fifth gate line 2Re1 may be used to form the bottom gate (second gate electrode) of the first transistor T1, a partial structure of the second protrusion part 21 may be used to form the bottom gate (second gate electrode) of the second transistor, and the first initial signal line Vinit1 may be used to provide the first initial signal terminal in FIG. 1. As shown in FIG. 13, the first initial signal line Vinit1 located on the side of the fifth gate line 2Re1 away from the conductive part 22 is used to provide the first initial signal terminal to the pixel driving circuit of the current row, and the first initial signal line Vinit1 located on the side of the sixth gate line 2G1 away from the conductive part 22 is used to provide a first initial signal terminal to the next row of pixel driving circuits. As shown in FIG. 19, in the same row of pixel driving circuits, the orthographic projection of the first initial signal line Vinit1 on the base substrate is located on the side of the orthographic projection of the third gate line G2 on the base substrate away from the first conductive part 11. The first initial signal line Vinit1 may include: a third extending part V3, a sixth extending part V6, a fifth extending part V5, a seventh extending part V7, and a fourth extending part V4 connected in sequence. The orthographic projection of the third extending part V3 on the base substrate, the orthographic projection of the fourth extending part V4 on the base substrate, and the orthographic projection of the fifth extending part V5 on the base substrate can all extend along the first direction X. The fifth extending part V5 may include a first sub extending part V51 and a second sub extending part V52, and the first sub extending part V51 is connected between the second sub extending part V52 and the seventh extending part V7. As shown in FIG. 19, in the same row of pixel driving circuits, the orthographic projection of the first initial signal line Vinit1 on the base substrate is located on the side of the orthographic projection of the third gate line G2 on the base substrate away from the first conductive part 11. In the same row of pixel driving circuits, the distance between the orthographic projection of the fifth extending part V5 on the base substrate and the orthographic projection of the third gate line G2 on the base substrate in the second direction Y may be smaller than the distance between the orthographic projection of the fourth extending part V4 on the base substrate and the orthographic projection of the third gate line G2 on the base substrate in the second direction Y; and the distance between the orthographic projection of the fifth extending part V5 on the base substrate and the orthographic projection of the third gate line G2 on the base substrate in the second direction Y may be smaller than the distance between of the orthographic projection of the third extending part V3 on the base substrate and the orthographic projection of the third gate line G2 on the base substrate in the second direction Y. The distance between the orthographic projection of a structure C on the base substrate and the orthographic projection of a structure D on the base substrate in the second direction Y may refer to the distance between adjacent sides of the orthographic projection of the structure C on the base substrate and the orthographic projection of the structure D on the base substrate in the second direction Y. Accordingly, the orthographic projection of the sixth extending part V6 on the base substrate, the orthographic projection of the fifth extending part V5 on the base substrate, and the orthographic projection of the seventh extending part V7 on the base substrate may form a concave structure facing the side of the orthographic projection of the third gate line G2 on the base substrate. The orthographic projection of the conductive part 22 on the base substrate may at least partially coincide with the orthographic projection of the first conductive part 11 on the base substrate, and the conductive part 22 may be used to form another electrode of the capacitor C in FIG. 1. In addition, the conductive part 22 may be provided with an opening 221.

As shown in FIGS. 10, 14 and 20, the structure of the second active layer is the same as that of the second active layer shown in FIG. 8. The material of the second active layer may be formed of indium gallium zinc oxide, and correspondingly, the first transistor T1 and the second transistor T2 may be N-type oxide transistors.

As shown in FIGS. 10, 15 and 21, in the third conductive layer, the orthographic projection of the first gate line 3Re1 on the base substrate may at least partially overlap with the orthographic projection of the fifth gate line 2Re1 on the base substrate; and the orthographic projection of the second gate line 3G1 on the base substrate may at least partially overlap with the orthographic projection of the sixth gate line 2G1 on the base substrate. For example, any segment of the orthographic projection of the first gate line 3Re1 on the base substrate on its extension may at least partially overlap with the orthographic projection of the fifth gate line 2Re1 on the base substrate; and any segment of the orthographic projection of the second gate line 3G1 on the base substrate on its extending may at least partially overlap with the orthographic projection of the sixth gate line 2G1 on the base substrate. The first gate line 3Re1 may be connected with the fifth gate line 2Re1 via a through hole, and the through hole may be located in the frame area of the display panel; and the second gate line 3G1 may be connected with the sixth gate line 2G1 via a through hole, and the through hole may be located in the frame area of the display panel. The orthographic projection of the second protrusion part 21 on the base substrate may at least partially overlap with the orthographic projection of the first protrusion part 31 on the base substrate. In addition, the third conductive layer may further include a second initial signal line Vinit2, the second initial signal line Vinit2 may be used to provide the second initial signal terminal in FIG. 1, and the orthographic projection of the second initial signal line Vinit2 on the base substrate may extend in the first direction X. In FIG. 15, the second initial signal line Vinit2 located on the side of the second gate line 3G1 away from the first gate line 3Re1 is used to provide a second initial signal terminal to the pixel driving circuit of the current row. In FIG. 20, the second initial signal line Vinit2 located on the side of the first gate line 3Re1 away from the second gate line 3G1 is used to provide a second initial signal terminal for the pixel driving circuit of the previous row. As shown in FIG. 21, in the same row of pixel driving circuits, the orthographic projection of the second initial signal line Vinit2 on the base substrate is located at the side of the orthographic projection of the fourth gate line Re2 on the base substrate away from the orthographic projection of the first conductive part 11 on the base substrate.

As shown in FIG. 21, the orthographic projection of the first gate line 3Re1 on the base substrate may be located between the orthographic projection of the third gate line G2 on the base substrate and the orthographic projection of the first conductive part 11 on the base substrate. The first gate line 3Re1 may shield the noise influence of the third gate line G2 on the first conductive part, thereby reducing the pull-up effect of the third gate line G2 on the first conductive part 11 at the end of the threshold compensation phase t2. As shown in FIG. 21, the second initial signal line Vinit2 may include an eighth extending part V8, an eleventh extending part V11, a tenth extending part V10, a twelfth extending part V12, and a ninth extending part V9, which are connected in sequence. The orthographic projection of the eighth extending part V8 on the base substrate, the orthographic projection of the ninth extending part V9 on the base substrate, and the orthographic projection of the tenth extending part V10 on the base substrate may all extend along the first direction X. In the same row of pixel driving circuits, the distance between the orthographic projection of the tenth extending part V10 on the base substrate and the orthographic projection of the fourth gate line Re2 on the base substrate in the second direction Y may be greater than the distance between the orthographic projection of the ninth extending part on the base substrate and the orthographic projection of the fourth gate line Re2 on the base substrate in the second direction Y, and the distance between the orthographic projection of the tenth extending part V10 on the base substrate and the orthographic projection of the fourth gate line Re2 on the base substrate may be greater than the distance between the orthographic projection of the eighth extending part on the base substrate and the orthographic projection of the fourth gate line Re2 on the base substrate in the second direction Y. That is, the orthographic projection of the eleventh extending part V11 on the base substrate, the orthographic projection of the tenth extending part V10 on the base substrate, and the orthographic projection of the twelfth extending part V12 on the base substrate form a concave structure at a side of the orthographic projection of the fourth gate line Re2 on the base substrate. The display panel may undergo conductive treatment on the second active layer by using the third conductive layer as a mask, that is, the region covered by the third conductive layer may be formed as the channel region of the transistor, and the region not covered by the third conductive layer may be formed as the conductor structure.

As shown in FIG. 21, the orthographic projection of the ninth extending part V9 in the pixel driving circuit of the previous row on the base substrate may be at least partly overlapped with the orthographic projection of the fourth extending part V4 in the pixel driving circuit of the current row on the base substrate. For example, any segment in the extension direction of the orthographic projection of the ninth extending part V9 in the pixel driving circuit of the previous row on the base substrate may be at least partly overlapped with the orthographic projection of fourth extending part V4 in the pixel driving circuit of the current row on the base substrate. The orthographic projection of the tenth extending part V10 in the pixel driving circuit of the previous row on the base substrate may at least partially overlap with the orthographic projection of the second sub extending part V52 in the pixel driving circuit of the current row on the base substrate, for example, any segment in the extension direction of the orthographic projection of the tenth extending part V10 in the pixel driving circuit of the previous row on the base substrate may at least partly overlap with the orthographic projection of the second sub extending part V52 in the pixel driving circuit of the current row on the base substrate. The orthographic projection of the tenth extending part V10 in the pixel driving circuit of the previous row on the base substrate does not overlap with the orthographic projection of the first sub extending part V51 in the pixel driving circuit of the current row on the base substrate. The orthographic projection of the eighth extending part V8 in the pixel driving circuit of the previous row on the base substrate may at least partially overlap with the orthographic projection of the third extending part V3 in the pixel driving circuit of the current row on the base substrate, for example, any segment in the extension direction of the orthographic projection of the eighth extending part V8 in the pixel driving circuit of the previous row on the base substrate may at least partially overlap with the orthographic projection of the third extending part V3 in the pixel driving circuit of the current row on the base substrate. The orthographic projection of the eleventh extending part V11 in the pixel driving circuit of the previous row on the base substrate may at least partially overlap with the orthographic projection of the sixth extending part V6 in the pixel driving circuit of the current row on the base substrate, for example, any segment in the extension direction of the orthographic projection of the eleventh extending part V11 in the pixel driving circuit of the previous row on the base substrate may at least partially overlap with the orthographic projection of the sixth extending part V6 in the pixel driving circuit of the current row on the base substrate. In this exemplary embodiment, the second initial signal line in the pixel driving circuit of the previous row is provided at least partly overlap with the first initial signal line in the pixel driving circuit of the current row, so that the shading effect to the display panel of the first initial signal line and the second initial signal line may be reduced. Meanwhile, the integration of the pixel driving circuit in the second direction may be improved, and the size of the pixel driving circuit in the second direction is reduced.

As shown in FIGS. 13 and 15, the included angle f3 between the orthographic projection of the twelfth extending part V12 on the base substrate and the orthographic projection of the tenth extending part V10 on the base substrate may be greater than the included angle $\alpha$ between the orthographic projection of the seventh extending part V7 on the base substrate and the orthographic projection of the fifth extending part V5 on the base substrate. Therefore, the seventh extending part V7 may not be covered by the second initial signal line Vinit2, and the seventh extending part V7 may be connected to the second electrode of the first transistor through the connecting part located in the fourth conductive layer.

As shown in FIGS. 11, 15 and 21, the first active layer may further include an eighth active part 68 connected to a side of the seventh active part 67 away from the sixth active part 66. In the first direction X, the orthographic projection of the eighth active part 68 on the base substrate may be located between the orthographic projection of the eleventh extending part V11 on the base substrate and the orthographic projections of the twelfth extending part V12 on the base substrate, and the orthographic projection of the eighth active part 68 on the base substrate may be located between the orthographic projection of the sixth extending part V6 on the base substrate and the orthographic projection of the seventh extending part V7 on the base substrate. At least part of the orthographic projection of the eighth active part 68 on the base substrate may be disposed opposite to at least part of the orthographic projection of the eleventh extending part V11 on the base substrate in the first direction X. That is, at least part of the orthographic projection of the eighth active part 68 on the base substrate may be located in the concave structure formed by the orthographic projection of the eleventh extending part V11 on the base substrate, the orthographic projection of the tenth extending part V10 on the base substrate, and the orthographic projection of the twelfth extending part V12 on the base substrate, and meanwhile, at least part of the orthographic projection of the eighth active part 68 on the base substrate may be located in the concave structure formed by the orthographic projection of the sixth extending part V6 on the base substrate, and the fifth extending part V5 on the base and the orthographic projection of the seventh extending part V7 on the substrate. This arrangement can facilitate the eighth active part 68 to be connected to the eleventh extending part V11 through the connection part located in the fourth conductive layer, and meanwhile can improve the integration of the pixel driving circuit.

As shown in FIGS. 10, 16, and 22, the fourth conductive layer may further include: a third connection part 43, a second connection part 42, a connection part 44, a connection part 45, a connection part 46, a connection part 47, and a data line Da. The data line Da may be used to provide the data signal terminal in FIG. 1, and the orthographic projection of the data line Da on the base substrate may extend along the second direction Y. The third connection part 43 may be connected to the eleventh extending part V11 via the through hole H3 and the eighth active part 68 may be connected to the second electrode of the seventh transistor and the second initial signal terminal via the through hole H4. As shown in FIG. 15, the size of the orthographic projection of the eleventh extending part V11 on the base substrate in the first direction X may be larger than the size of the orthograph. By providing the size of the eleventh extending part V11 in the first direction X to be larger can facilitate the connection of the eleventh extending part V11 with the through hole H3. In addition, in other exemplary embodiments, the third connecting part 43 can also be connected to the tenth extending part V10. If the third connecting part 43 is connected to the tenth extending part V10, correspondingly, the tenth extending part V10 may have a larger size in the second direction, and this connection method will increase the size of the pixel driving circuit in the second direction. Since the third active part 63 is extended in the second direction in this exemplary embodiment, the driving transistor T3 may have a relative larger size in the second direction Y. Therefore, connecting the third connecting part 43 to the eleventh extending part V11 can reduce the size of the pixel driving circuit in the second direction to a certain extent, so as to reserve enough space for disposing the driving transistor T3. The second connection part 42 may be connected to the second active layer at an end of the first sub active part 711 away from the second sub active part 712 via the through hole H5, and may be connected to the seventh extending part V7 via the through hole H6 to connect to the first initial signal terminal and the second electrode of the first transistor. The connection part 44 may be connected to the conductive part 22 via the through hole H7. The connection part 45 may be connected to the active part 61 via the through hole H8, and connected to the fourth sub active part 714 via the through hole H9 to connect the second electrode of the second transistor and the second electrode of the driving transistor. The connection part 46 may be connected to the first active layer on a side of the fifth active part 65 via the through hole H10 to connect the first electrode of the fifth transistor. The connection part 47 may connect the first active layer between the sixth active part 66 and the seventh active part 67 via the through hole H12 to connect the second electrode of the sixth transistor and the first electrode of the seventh transistor. The data line Da can be connected to the first active layer on the side of the fourth active part 64 away from the third active part 63 via the through hole H13 to connect the first electrode of the fourth transistor and the data signal terminal. The orthographic projection of the through hole H1 on the base substrate may be located within the orthographic projection of the opening 221 on the base substrate to prevent the conductive structure in the through hole H1 from being electrically connected to the conductive part 22.

As shown in FIGS. 10 and 17, the fifth conductive layer may include a power supply line VDD and a conductive part 51. The power supply line VDD may include: a first power supply line VDD1 and a second power supply line VDD2. The orthographic projection of the first power supply line VDD1 on the base substrate may extend along the first direction X. The second power supply line VDD2 may be connected to the first power supply line VDD1, and the orthographic projection of the second power supply line VDD2 on the base substrate may extend in the second direction Y. As shown in FIG. 14, the orthographic projection of the fourth sub active part 714 on the base substrate and the orthographic projection of the second sub active part 712 on the base substrate may be sequentially distributed in the first direction X, and the orthographic projection of the first extending part 7131 on the base substrate and the orthographic projection of the first sub active part 411 on the base substrate may be distributed in the second direction Y. As shown in FIG. 10, the orthographic projection of the first power supply line VDD1 on the base substrate may cover the orthographic projection of the fourth sub active part 714 on the base substrate and the orthographic projection of the second sub active part 712 on the base substrate. The orthographic projection of the second power supply line VDD2 on the base substrate may cover the orthographic projection of the first extending part 7131 on the base substrate and the orthographic projection of the first sub active part 711 on the base substrate. Covering the first active part 71 with the power supply line VDD can prevent the characteristics of the first transistor T1 and the second transistor T2 from changing under the action of light illumination. The power supply line VDD can be connected to the connecting part 44 via the through hole H11 to connect an electrode of the capacitor C. The first power supply line VDD1 and the second power supply line VDD2 in the present exemplary embodiment may be formed in a mesh structure to reduce the voltage drop on the power supply line itself. The conductive part 51 can be connected to a power supply line (not shown) on its left side, and is connected to the connection part 46 via the through hole H14 to connect to the first electrode of the fifth transistor.

As shown in FIGS. 10 and 17, the orthographic projection of the first power supply line VDD1 on the base substrate may be located between the orthographic projection of the first conductive part 11 on the base substrate and the orthographic projection of the second gate line 3G1 on the base substrate. Meanwhile, the orthographic projection of the first power line VDD1 on the base substrate may be located between the orthographic projection of the first conductive part 11 on the base substrate and the orthographic projection of the sixth gate line 2G1 on the base substrate. The first power supply line VDD1 may shield the noise influence of the sixth gate line 2G1 and the second gate line 3G1 on the first conductive part 11.

Figure 23:
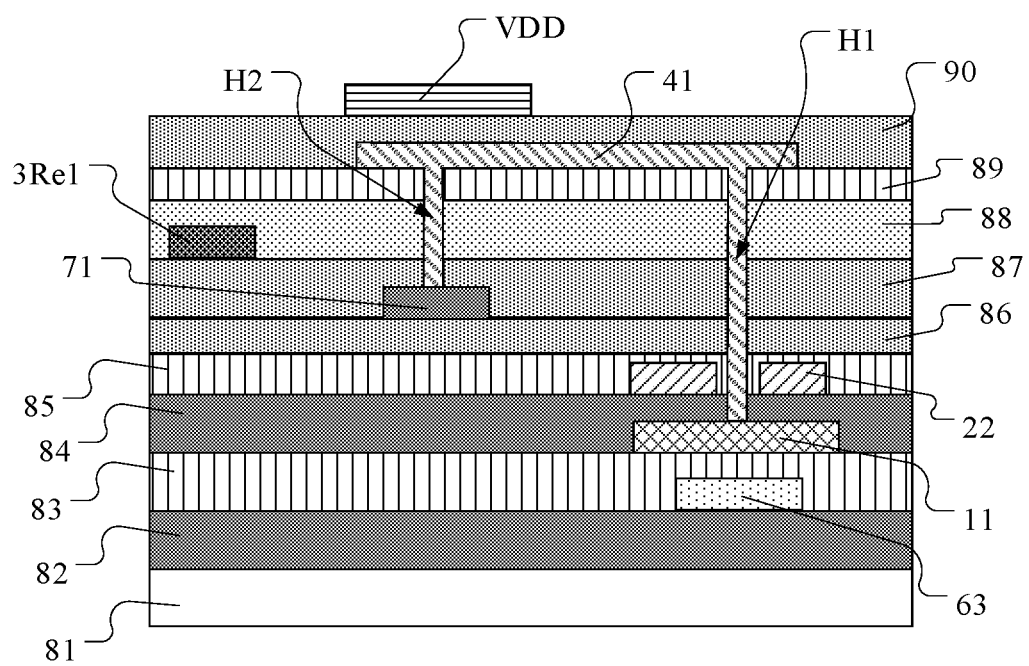
FIG. 23 is a partial sectional view along the dashed line A in FIG. 10.

As shown in FIG. 23, it is a partial cross-sectional view taken along the dotted line A in FIG. 10. The display panel may further include: a first buffer layer 82, a first insulating layer 83, a second insulating layer 84, a third insulating layer 85, a second buffer layer 86, a fourth insulating layer 87, a first dielectric layer 88, a second dielectric layer 89 and the first planarization layer 90. The base substrate 81, the first buffer layer 82, the first active layer, the first insulating layer 83, the first conductive layer, the second insulating layer 84, the second conductive layer, the third insulating layer 85, the second buffer layer 86, the second active layer, the fourth insulating layer 87, the third conductive layer, the first dielectric layer 88, the second dielectric layer 89, the fourth conductive layer, the first planarization layer 90, and the fifth conductive layer are disposed in sequence. The buffer layer 82 may include at least one of a silicon oxide layer and a silicon nitride layer. The first insulating layer 83, the second insulating layer 84, the third insulating layer 85, the second buffer layer 86, the fourth insulating layer 87, the first dielectric layer 88, and the second dielectric layer 89 may be silicon oxide layers. The material of the first planarization layer can be an organic material, such as polyimide (PI), polyethylene terephthalate (PET), polyethylene naphthalate (PEN), silicon-glass bonding Structure (SOG) and other materials. The base substrate 81 may include a glass substrate, a barrier layer, and a polyimide layer stacked in sequence, and the barrier layer may be an inorganic material. The material of the fourth conductive layer and the fifth conductive layer may include metal materials, such as one or an alloy of molybdenum, aluminum, copper, titanium, niobium, or a molybdenum/titanium alloy or laminate, or may be a titanium/aluminum/titanium laminate. The material of the first conductive layer, the second conductive layer, and the third conductive layer can be one or an alloy of molybdenum, aluminum, copper, titanium, niobium, or molybdenum/titanium alloy or laminate. The display panel may further include: a second planarization layer, an anode layer, a pixel defining layer, a support layer, and the like.

Figure 24:
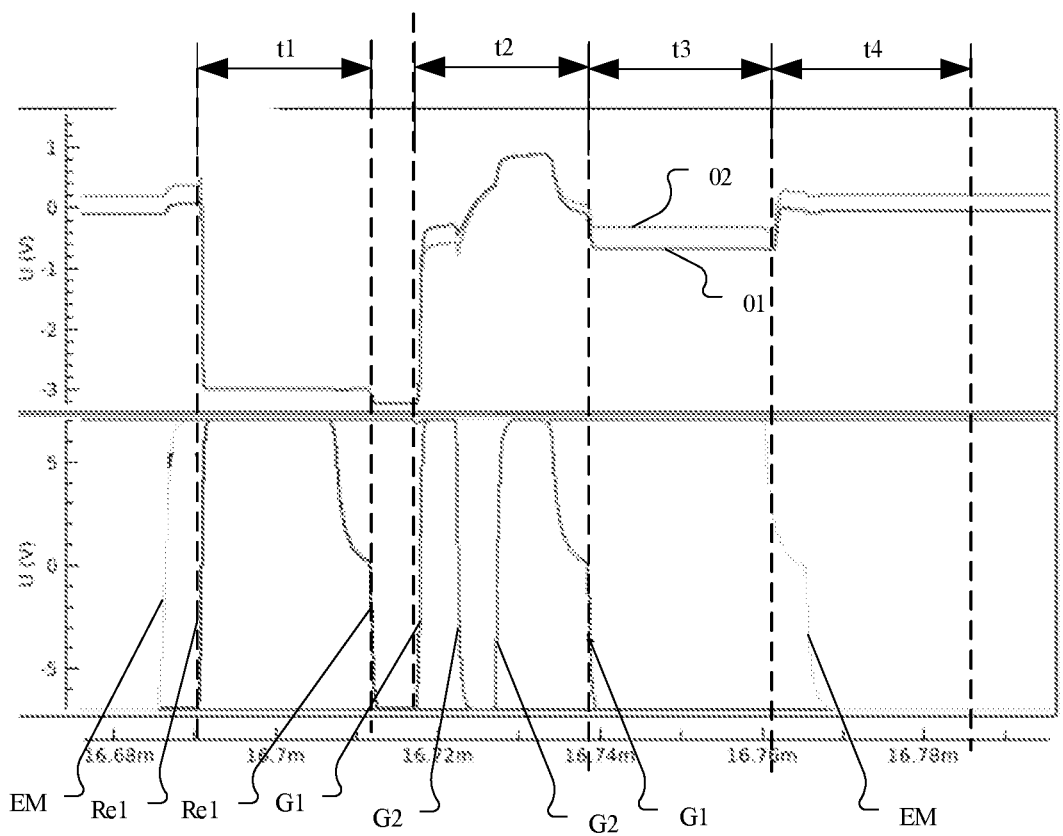
FIG. 24 is a simulation timing diagram of each node of the display panel according to the present disclosure and the display panel in the related art.

As shown in FIG. 24, a simulation timing diagram of each node of the display panel according to the present disclosure and the display panel in the related art. In FIG. 24, Re1 represents the timing diagram of the first reset signal terminal, G1 represents the timing diagram of the first gate driving signal terminal, G2 represents the timing diagram of the second gate driving signal terminal, EM represents the timing diagram of the enable signal terminal, 01 represents the timing diagram of node N in the related art, and 02 represents the timing diagram of node N in this exemplary embodiment. As shown in FIG. 24, the display panels in the present exemplary embodiment and the related art are driven with alike driving method, which includes a reset phase t1, a compensation phase t2, a buffer phase t3, and a light-emitting phase t4. In the reset phase t1: the first reset signal terminal, the enable signal terminal, and the second gate driving signal terminal output a high level, the second reset signal terminal and the first gate driving signal terminal output a low level, T1, T7 are turned on, the first initial signal terminal Vinit1 resets the node N, and the second initial signal terminal Vinit2 resets an electrode of the light-emitting unit. In the compensation phase t2: the first gate driving signal terminal G1, the enable signal terminal, and the second reset signal terminal output a high level, the first reset signal terminal outputs a low level, and in at least part of the compensation phase, the second gate driving signal terminal G2 outputs a low level, the second transistor T2 and the fourth transistor T4 are turned on, and the data signal terminal Da writes a compensated voltage to the node N. In the buffer phase: the first gate driving signal terminal and the first reset signal terminal output a low level, the second gate driving signal terminal, the second reset signal terminal and the enable signal terminal output a high level, and the first gate driving signal terminal outputs switches from a high level to a low level, thus the first gate driving signal terminal will pull down the voltage of the node N. It can be seen from FIG. 24 that the pull-down offset of the node N of the display panel provided by this exemplary embodiment is less than the pull-down offset of the node N of the display panel in the related art, thereby improving the display effect of the display panel to a certain extent. In the light-emitting phase t4: the enable signal terminal, the first gate driving signal terminal and the first reset signal terminal output a low level signal, the second gate driving signal terminal and the second reset signal terminal output a high level signal, the fifth transistor and the sixth transistor are turned on, and the light-emitting unit emits light. It should be noted that, in the compensation phase t2, the effective level duration (high level duration) of G1 can be greater than the effective level duration (low level duration) of G2, and an effective pulse of the second gate driving signal terminal G2 may drive one row of pixel driving circuits, and one effective pulse of the first gate driving signal terminal G1 may drive multiple rows of pixel driving circuits.

The present exemplary embodiment also provides a display device, which includes the above-mentioned display panel. The display device may be a display device such as a mobile phone, a tablet computer, a TV, and the like.

Other embodiments of the present disclosure will be readily conceivable to those skilled in the art upon consideration of the specification and practice of what is disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel comprising a pixel driving circuit, wherein the pixel driving circuit comprises a driving transistor, a first transistor and a second transistor, a gate electrode of the first transistor is connected to a first gate line, a first electrode of the first transistor is connected to gate electrode of the driving transistor, a gate electrode of the second transistor is connected to a second gate line, a first electrode of the second transistor is connected to the gate electrode of the driving transistor, and a second electrode of the second transistor is connected to a second electrode of the driving transistor, the driving transistor is a P type transistor, the first and second transistors are N type transistors, and the display panel further comprises:
   a base substrate;
   a first conductive layer, disposed at a side of the base substrate and comprising a first conductive part, wherein the first conductive part is configured to form the gate electrode of the driving transistor;
   a third conductive layer, disposed at a side of the base substrate and comprising the first gate line and the second gate line, wherein an orthographic projection of the first gate line on the base substrate and an orthographic projection of the second gate line on the base substrate are both extended in a first direction, and an orthographic projection of the first conductive part on the base substrate is positioned between the orthographic projection of the first gate line on the base substrate and the orthographic projection of the second gate line on the base substrate; and a first connecting part, connected to the first conductive part via a through hole, and connected to the first electrode of the first transistor and the first electrode of the second transistor, wherein an orthographic projection of the first connecting part on the base substrate is positioned between the orthographic projection of the first gate line on the base substrate and the orthographic projection of the second gate line on the base substrate.

2. The display panel according to claim 1, wherein the third conductive layer is disposed at a side of the first conductive layer away from the base substrate, and the display panel further comprises:

a fourth conductive layer disposed at a side of the third conductive layer away from the base substrate and comprising the first connecting part.

3. The display panel according to claim 2, wherein the display panel further comprises:

a second active layer, disposed between the third conductive layer and the first conductive layer and comprising a first active part, wherein the first active part comprises a first sub active part, a second sub active part and a third sub active part connected between the first sub active part and the second sub active part, and wherein the first sub active part is configured to form a channel region of the first transistor, and the second sub active part is configured to form a channel region of the second transistor, wherein the first connecting part is connected to the third sub active part via a through hole.

4. The display panel according to claim 3, wherein the third sub active part comprises:

a first extending part, wherein an orthographic projection of the first extending part on the base substrate is extended in a second direction, at least a part of orthographic projection of the first extending part on the base substrate is disposed opposite to the orthographic projection of the first conductive part on the base substrate in the first direction, and the second direction is intersected with the first direction, wherein at least a part of the orthographic projection of the first connecting part on the base substrate is extended along the first direction, and the first connecting part is connected to the first extending part via a through hole.

5. The display panel according to claim 4, wherein an orthographic projection of the second sub active part on the base substrate and the orthographic projection of the first conductive part on the base substrate are disposed at a same side of the orthographic projection of the second gate line on the base substrate.

6. The display panel according to claim 5, wherein the orthographic projection of the second sub active part on the base substrate is positioned at a side of the orthographic projection of the first extending part on the base substrate along the first direction, and the orthographic projection of the second sub active part on the base substrate is positioned on a side of orthographic projection of the first extending part on the base substrate facing the orthographic projection of the first conductive part on the base substrate, and the third conductive layer further comprises:

a first protrusion part connected to the second gate line, wherein an orthographic projection of the first protrusion part on the base substrate is covered on the second sub active part, and at least a part of the first protrusion part is configured to form a first gate electrode of the second transistor, and wherein, the orthographic projection of the first protrusion part on the base substrate is positioned between the orthographic projection of the second gate line on the base substrate and the orthographic projection of the first connecting part on the base substrate.

7. The display according to claim 6, wherein a part of the first gate line is configured to form a first gate electrode of the first transistor, and the display panel further comprises a second conductive layer, disposed between the first conductive layer and the second active layer, and the second conductive layer comprises:

a fifth gate line, wherein an orthographic projection of the fifth gate line on the base substrate is extended in the first direction, the orthographic projection of the fifth gate line on the base substrate is at least partly overlapped with the orthographic projection of the first gate line on the base substrate, the fifth gate line is connected to the first gate line via a through hole, and a part of the fifth gate line is configured to form a second gate electrode of the first transistor;

a sixth gate line, wherein an orthographic projection of the sixth gate line on the base substrate is extended in the first direction, the orthographic projection of the sixth gate line on the base substrate is at least partly overlapped with the orthographic projection of the second gate line on the base substrate, and the sixth gate line is connected to the second gate line via a through hole; and a second protrusion part, connected to the sixth gate line, wherein an orthographic projection of the second protrusion part on the base substrate is at least partly overlapped with the orthographic projection of the first protrusion part on the base substrate, and at least a part of the second protrusion part is configured to form a second gate electrode of the second transistor, wherein, the orthographic projection of the first connecting part on the base substrate is positioned between the orthographic projection of the fifth gate line on the base substrate and the orthographic projection of the sixth gate line on the base substrate.

8. The display panel according to claim 5, wherein the first active part comprises:

a fourth sub active part, connected to an end of the second sub active part away from the third sub active part, wherein along the second direction, an orthographic projection of the fourth sub active part on the base substrate is positioned between the orthographic projection of the first conductive part on the base substrate and the orthographic projection of the second gate line on the base substrate, and the second direction is intersected with the first direction.

9. The display panel according to claim 2, wherein the display panel further comprises:

a first active layer, disposed between the base substrate and the first conductive layer and comprising a third active part, wherein the third active part is configured to form a channel region of the driving transistor, wherein an orthographic projection of the third active part on the base substrate is extended along a second direction, and the second direction is intersected with the first direction.

10. The display panel according to claim 9, wherein a size of the orthographic projection of the first conductive part on the base substrate along the first direction is smaller than a size of the orthographic projection of the first conductive part on the base substrate along the second direction.

11. The display panel according to claim 2, wherein the display panel further comprises:
a fifth conductive layer, disposed at a side of the fourth conductive layer away from the base substrate and comprising a power supply line, wherein an orthographic projection of the power supply line on the base substrate is covered on the orthographic projection of the first active part on the base substrate.

12. The display panel according to claim 11, wherein the power supply line comprises:
a first power supply line, wherein an orthographic projection of the first power supply line on the base substrate is extended along the first direction; and
a second power supply line, connected to the first power supply line, wherein an orthographic projection of the second power supply line on the base substrate is extended along a second direction, and the second direction is intersected with the first direction.

13. The display panel according to claim 12, wherein the orthographic projection of the first power supply line on the base substrate is positioned between the orthographic projection of the first conductive part on the base substrate and the orthographic projection of the second gate line on the base substrate.

14. The display panel according to claim 12, wherein the display panel further comprises:
a second active layer, disposed between the third conductive layer and the first conductive layer and comprising a first active part, wherein the first active part comprises a fourth sub active part, a second sub active part, a first extending part and a first sub active part that are successively connected, and wherein the first sub active part is configured to form a channel region of the first transistor, and the second sub active part is configured to form a channel region of the second transistor,
wherein an orthographic projection of the fourth sub active part on the base substrate and an orthographic projection of the second sub active part on the base substrate are arranged successively along the first direction, and wherein an orthographic projection of the first extending part on the base substrate and an orthographic projection of the first sub active part on the base substrate are arranged successively along the second direction,
the orthographic projection of the first power supply line on the base substrate is covered on the orthographic projection of the fourth sub active part on the base substrate and the orthographic projection of the second sub active part on the base substrate, and
the orthographic projection of the second power supply line on the base substrate is covered on the orthographic projection of the first extending part on the base substrate, and the orthographic projection of the first sub active part on the base substrate.

15. The display panel according to claim 2, wherein a second electrode of the first transistor is connected to a first initial signal line, the display panel further comprises a light emitting unit, and the pixel driving circuit further comprises a fourth transistor, a seventh transistor, and wherein a gate electrode of the fourth transistor is connected to the third gate line, a second electrode of the fourth transistor is connected to a first electrode of the driving transistor, a first electrode of the seventh transistor is connected to a first electrode of the light emitting unit, and a second electrode of the seventh transistor is connected to a second initial signal line,
wherein the first conducive layer further comprises:
a fourth gate line, wherein an orthographic projection of the fourth gate line on the base substrate is extended along the first direction, and a part of the fourth gate line is configured to form the gate electrode of the seventh transistor,
wherein the display panel further comprises:
a second conductive layer, disposed between the third conductive layer and the first conductive layer and comprising the first initial signal line, wherein an orthographic projection of the first initial signal line on the base substrate is extended along the first direction, and in a same pixel driving circuit row, the orthographic projection of the first initial signal line on the base substrate is positioned at a side of the orthographic projection of the third gate line on the base substrate away from the orthographic projection of the first conductive part on the base substrate, and
wherein the third conductive layer comprises the second initial signal line, and an orthographic projection of the second initial signal line on the base substrate is extended along the first direction, and in a same pixel driving circuit row, the orthographic projection of the second initial signal line on the base substrate is positioned at a side of the orthographic projection of the fourth gate line on the base substrate away from the orthographic projection of the first conductive part on the base substrate.

16. The display panel according to claim 15, wherein the display panel comprises a plurality of pixel driving circuits, and the plurality of pixel driving circuits comprises a first pixel driving circuit and a second pixel driving circuit adjacent along a second direction, wherein the second direction is intersected with the first direction, and
an orthographic projection of the first initial signal line in the first pixel driving circuit on the base substrate is at least partly overlapped with an orthographic projection of the second initial signal line in the second pixel driving circuit on the base substrate.

17. The display panel according to claim 16, wherein the first initial signal line in the first pixel driving circuit comprises a second conductive part,
wherein the fourth conductive layer further comprises:
a second connecting part, connected to the second conductive part via a though hole and connected to the second electrode of the first transistor, and
wherein an orthographic projection of the second conductive part in the first pixel driving circuit on the base substrate is not overlapped with the orthographic projection of the second initial signal line in the second pixel driving circuit on the base substrate.

18. The display panel according to claim 17, wherein the first initial signal line in the first pixel driving circuit comprises:
a fourth extending part, wherein an orthographic projection of the fourth extending part on the base substrate is extended in the first direction;
a fifth extending part, connected to the fourth extending part, wherein an orthographic projection of the fifth extending part on the base substrate is extended in the first direction, and in a same pixel driving circuit row, a distance between the orthographic projection of the fifth extending part on the base substrate and the orthographic projection of the third gate line on the base substrate along the second direction is smaller than a distance between the orthographic projection of the fourth extending part on the base substrate and the orthographic projection of the third gate line on the base substrate along the second direction, and the fifth extending part comprises a first sub extending part and a second sub extending part; and a seventh extending part, connected between the first sub extending part and the fourth extending part, wherein the second initial signal line in the second pixel driving circuit comprises:

a ninth extending part, wherein an orthographic projection of the ninth extending part on the base substrate is extended in the first direction, and the orthographic projection of the ninth extending part on the base substrate is at least partly overlapped with the orthographic projection of the fourth extending part on the base substrate;

a tenth extending part, connected to the ninth extending part, wherein an orthographic projection of the tenth extending part on the base substrate is extended in the first direction, and in a same pixel driving circuit row, a distance between the orthographic projection of the tenth extending part on the base substrate and the orthographic projection of the fourth gate line on the base substrate along the second direction is greater than a distance between the orthographic projection of the ninth extending part on the base substrate and the orthographic projection of the fourth gate line on the base substrate along the second direction, the orthographic projection of the tenth extending part on the base substrate is at least partly overlapped with an orthographic projection of the second sub extending part on the base substrate, and the orthographic projection of the tenth extending part on the base substrate is not overlapped with an orthographic projection of the first sub extending part on the base substrate; and a twelfth extending part, connected between the tenth extending part and the ninth extending part, wherein an angle between an orthographic projection of the twelfth extending part on the base substrate and the orthographic projection of the tenth extending part on the base substrate is greater than an angle between the orthographic projection of the seventh extending part on the base substrate and the orthographic projection of the fifth extending part on the base substrate, and wherein the seventh extending part is configured to form the second conductive part.

19. The display panel according to claim 18, wherein the second initial signal line in the second pixel driving circuit comprises:

an eighth extending part, wherein an orthographic projection of the eighth extending part on the base substrate is extended in the first direction, the tenth extending part is connected between the eighth extending part and the ninth extending part, and in a same pixel driving circuit row, a distance between the orthographic projection of the tenth extending part on the base substrate and the orthographic projection of the fourth gate line on the base substrate along the second direction is greater than a distance between the orthographic projection of the eighth extending part on the base substrate and the orthographic projection of the fourth gate line on the base substrate along the second direction; and an eleventh extending part, connected between the tenth extending part and the eighth extending part, wherein the first initial signal line in the first pixel driving circuit further comprises:

a third extending part, wherein an orthographic projection of the third extending part on the base substrate is extended in the first direction, the fifth extending part is connected between the third extending part and the fourth extending part, and a distance between the orthographic projection of the fifth extending part on the base substrate and the orthographic projection of the third gate line on the base substrate along the second direction is smaller than a distance between the orthographic projection of the third extending part on the base substrate and the orthographic projection of the third gate line on the base substrate along the second direction, and the orthographic projection of the eighth extending part on the base substrate is at least partly overlapped with the orthographic projection of the third extending part on the base substrate; and a sixth extending part, connected between the fifth extending part and the third extending part, wherein the orthographic projection of the eleventh extending part on the base substrate is at least partly overlapped with the orthographic projection of the sixth extending part on the base substrate, wherein the display panel further comprises a first active layer disposed between the base substrate and the first conductive layer, and wherein the first active layer comprises:

a seventh active part, configured to form a channel region of the seventh transistor; and an eighth active part, connected to a side of the seventh active part, and along the first direction, an orthographic projection of the eighth active part on the base substrate is positioned between the orthographic projection of the sixth extending part on the base substrate and the orthographic projection of the seventh extending part on the base substrate, and the orthographic projection of the eighth active part on the base substrate is opposite to the orthographic projection of the eleventh extending part on the base substrate along the first direction, and wherein the fourth conductive layer further comprises:

a third connecting part, connected respectively to the eighth active part and the eleventh extending part via through holes.

20. The display panel according to claim 19, wherein a size of the orthographic projection of the eleventh extending part on the base substrate along the first direction is greater than the orthographic projection of the tenth extending part on the base substrate along the second direction.

21. The display panel according to claim 2, wherein the orthographic projection of the first connecting part on the base substrate is extended along the first direction.

22. The display panel according to claim 1, wherein the pixel driving circuit further comprises a fourth transistor, a gate electrode of the fourth transistor is connected to a third gate line, and a second electrode of the fourth transistor is connected to a first electrode of the driving transistor, and wherein the first conductive layer further comprises the third gate line, and an orthographic projection of the third gate line on the base substrate is positioned at a side of the orthographic projection of the first gate line on the base substrate away from the orthographic projection of the first conductive part on the base substrate.

23. A display device comprising the display panel according to claim 1.

\* \* \* \* \*